(12) United States Patent
Kagii et al.

(10) Patent No.: US 7,405,469 B2
(45) Date of Patent: Jul. 29, 2008

(54) SEMICONDUCTOR DEVICE AND METHOD OF MANUFACTURING THE SAME

(75) Inventors: Hidemasa Kagii, Takasaki (JP); Akira Muto, Haruna (JP); Ichio Shimizu, Tamamura (JP); Katsuo Arai, Takasaki (JP); Hiroshi Sato, Takasaki (JP); Hiroyuki Nakamura, Maebashi (JP); Masahiko Osaka, Yuki (JP); Takuya Nakajo, Numata (JP); Keiichi Okawa, Takasaki (JP); Hiroi Oka, Tamamura (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/783,919

(22) Filed: Apr. 13, 2007

(65) Prior Publication Data

US 2007/0210430 A1 Sep. 13, 2007

Related U.S. Application Data

(62) Division of application No. 11/349,219, filed on Feb. 8, 2006, now Pat. No. 7,220,617.

(30) Foreign Application Priority Data

Feb. 10, 2005 (JP) ............................. 2005-034739

(51) Int. Cl.
*H01L 23/495* (2006.01)

(52) U.S. Cl. .................. 257/676; 257/678; 257/687; 438/106; 438/123

(58) Field of Classification Search ............. 257/676, 257/678, 687, 787; 438/106, 123
See application file for complete search history.

(56) References Cited

U.S. PATENT DOCUMENTS

| 5,477,611 | A | 12/1995 | Sweis et al. |
| 6,163,069 | A * | 12/2000 | Oohira et al. ............... 257/684 |
| 6,670,718 | B2 * | 12/2003 | Chinda et al. ............... 257/774 |
| 7,157,308 | B2 | 1/2007 | Takano |
| 2006/0270106 | A1 | 11/2006 | Chiu et al. |

FOREIGN PATENT DOCUMENTS

| JP | 2003-051513 | 2/2003 |
| JP | 2004-500720 | 1/2004 |

* cited by examiner

*Primary Examiner*—Theresa T Doan
(74) *Attorney, Agent, or Firm*—Mattingly, Stanger, Malur & Brundidge, P.C.

(57) ABSTRACT

A semiconductor chip is sealed by resin without covering an outer terminal of a semiconductor device having a power transistor. A semiconductor chip having a power transistor is housed within a recess of a metal cap while a drain electrode on a first surface of the semiconductor chip is bonded to a bottom of the recess via a connection material. A gate electrode and a source electrode are formed on a second surface opposite to the first surface of the semiconductor chip, and the gate electrode and the source electrode are bonded with metal plate terminals 6G, 6S via connection materials 5b, 5c. In addition, the semiconductor chip is sealed by a resin sealing body with mounting-surfaces of the metal plate terminals 6G, 6S being exposed. Mounting surfaces of the metal plate terminals 6G, 6S and a third part of the metal cap are bonded to electrodes on a mounting board 10 via connection materials 5e, 5f and 5g.

10 Claims, 24 Drawing Sheets

SEMICONDUCTOR DEVICE AND METHOD OF MANUFACTURING THE SAME

This application is a divisional application of U.S. application Ser. No. 11/349,219, filed Feb. 8, 2006 now U.S. Pat. No. 7,220,617, now allowed, the entirety of which is incorporated herein by reference.

BACKGROUND OF THE INVENTION

1. Field of the Invention

The present invention relates to a semiconductor device and a method for manufacturing the device, particularly relates to a packaging technique of a semiconductor device having a power transistor.

2. Description of Related Art

A high-power semiconductor device includes a semiconductor device having a semiconductor chip in which a power transistor such as power MOSFET (Metal Oxide Semiconductor Field-Effect-Transistor), IGBT (Insulated Gate Bipolar Transistor), and bipolar power transistor is formed.

The semiconductor device having such a power transistor is described in, for example, International Patent Application No. W2001/075961 (patent literature 1) which discloses a structure of a semiconductor device having the power MOS FET. The paragraph 0024 and FIG. 21 of the patent literature 1 disclose a configuration in which a drain electrode of a die (semiconductor chip) is connected to a surface of an inner web in a clip by epoxy containing silver, and optimally epoxy having low stress and high adhesive force is coated around an edge of a die in a ring pattern to seal a package and add structural strength to the package.

Moreover, for example, JP-A-2003-51513 (patent literature 2) discloses a configuration in which an electrode of a semiconductor chip having a power MOS FET is connected with a metal strip. The paragraph 0041 and FIG. 5 of the patent literature 2 disclose a configuration in which the metal strip is directly bonded onto an electrode pad of a semiconductor device (semiconductor chip) using ultrasonic energy, and furthermore periphery of the bonded portion between the electrode pad and the metal strip is sealed by moisture-resistant resin having flexibility, moisture resistance and heat resistance.

[Patent literature 1] International Patent Application No. W 2001-075961 (paragraph 0024 and FIG. 20).

[Patent literature 2] JP-A-2003-51513 (paragraph 0012, 0041, FIG. 5 and the like).

SUMMARY OF THE INVENTION

However, the inventors found that the semiconductor device having the power transistor had the following problems.

That is, first, there is a problem that filling control of the resin for sealing the semiconductor chip is difficult. When a surface of the semiconductor chip is exposed, a problem on environmental-stress resistance such as leakage defect (particularly, area short at the outer circumferential portion of the semiconductor chip) or corrosion may occur. Therefore, the semiconductor chip is preferably sealed by resin, however, when the semiconductor chip as a whole is covered with resin, the resin may concernedly cover surfaces of source and gate electrodes of the semiconductor chip, or contaminate them, and therefore filling control of resin for sealing the semiconductor chip, or control of a surface level of the resin is difficult, and actually only a limited area of side faces and the like of the semiconductor chip can be covered. Since reduction in thickness of package tends to be further advanced hereinafter, such a problem will be increasingly significant.

Second, there is a problem that outer terminals for a gate and a source of the semiconductor device vary depending on chip size of the semiconductor chip, or positions or size of the gate and source electrodes of the semiconductor chip. That is, in the case that the gate and source electrodes of the semiconductor chip are formed directly as outer terminals for the gate and source of the semiconductor device, even in the same semiconductor device, when the semiconductor chip varies, the positions or size of the outer terminals for the gate and source of the semiconductor chip may also vary.

Third, there is a problem that since the semiconductor chip is directly connected to a mounting board having larger heat conductivity than the semiconductor chip, a connection portion for connecting the source and gate electrodes of the semiconductor chip to electrodes of the mounting board is applied with large thermal stress, and therefore thermal fatigue occurs early in the connection portion, consequently the connection portion is broken.

An object of the invention is to provide a technique that can seal the semiconductor chip by resin without covering the outer terminals of the semiconductor device having the power transistor.

Another object of the invention is to provide a technique that can add versatility to an electrode configuration of the semiconductor device having the power transistor.

Another object of the invention is to provide a technique that can improve a thermal fatigue life of the connection portion between the semiconductor device having the power transistor and the mounting board.

The above and other objects and novel features of the invention will be clarified according to description of the specification and accompanied drawings.

Summary of typical one of the inventions disclosed in the application is briefly described as follows.

Thus, in the invention, a metal plate terminal is provided on an electrode on a surface, which faces a mounting board, of a semiconductor chip housed in a recess of a metal cap via a connection material, and the semiconductor chip is sealed by a resin sealing body such that the metal plate terminal is exposed.

Advantage of the Invention

Advantageous effects obtained from the typical one of the inventions disclosed in the application is briefly described as follows.

That is, the metal plate terminal is provided on the electrode on the surface, which faces the mounting board, of the semiconductor chip housed in the recess of the metal cap via the connection material, and the semiconductor chip is sealed by the resin sealing body such that the metal plate terminal is exposed, thereby in the semiconductor device having the power transistor, the semiconductor chip can be sealed by resin without covering the electrode of the semiconductor device.

Moreover, the metal plate terminal is provided on the electrode on the surface, which faces the mounting board, of the semiconductor chip housed in the recess of the metal cap via the connection material, thereby the electrode configuration of the semiconductor device having the power transistor can be provided with versatility.

The metal plate terminal is provided on the electrode on the surface, which faces the mounting board, of the semiconductor chip housed in the recess of the metal cap via the connection material, thereby the thermal fatigue life of the connection portion between the semiconductor device having the power transistor and the mounting board can be improved.

DESCRIPTION OF THE PREFERRED EMBODIMENTS

While the following embodiments are described with being divided into several sections or embodiments if necessary for convenience, they are not independent of one another except for a particularly specified case, and in a relation that one is a modification, detail, or supplementary explanation of part or all of the other. Moreover, when the following embodiments refer to the number of elements (including number, numeral value, amount, and range), the number is not limited to the particular number and may be the particular number or more or less, except for a particularly specified case and a case that it is principally obviously limited to a particular number. Furthermore, it is appreciated in the following embodiments that components (including the number of element steps) of them are not necessarily indispensable except for a particularly specified case and a case that it is considered to be principally obviously indispensable. Similarly, the following embodiments are assumed to include those, which are substantially akin or similar to the embodiments in shapes and the like, except for a particularly specified case and a case that it is considered to be principally obviously not akin or similar to them. Regarding the numeral value and the range, they are similarly assumed. Same reference signs are marked with those having the same function in all figures for explaining the embodiments so that repeated description is not made as long as possible. Hereinafter, embodiments of the invention will be described in detail according to drawings.

Embodiment 1

Figure 1:
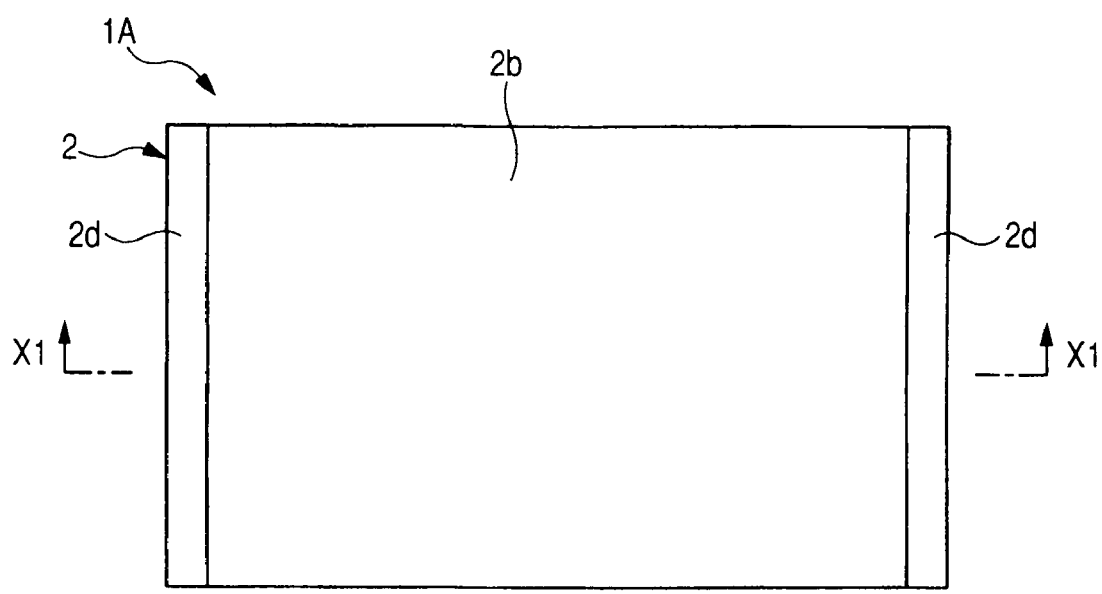
FIG. 1 is a plan view of a top of a semiconductor device of an embodiment of the invention.
Figure 2:
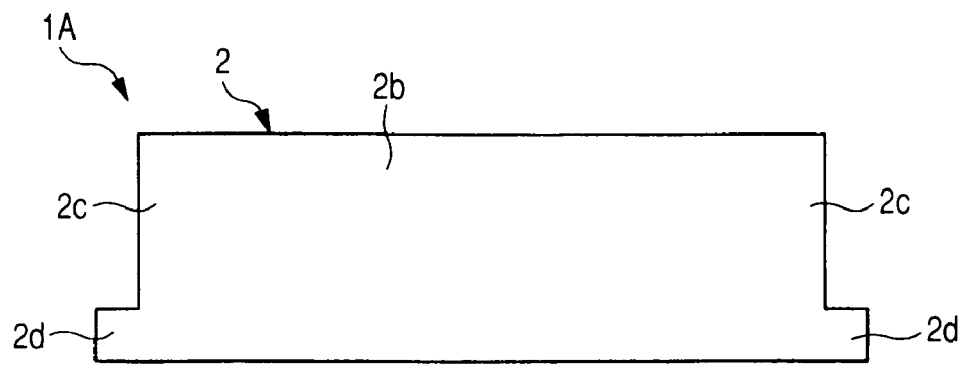
FIG. 2 is a side view of the semiconductor device of FIG. 1.
Figure 3:
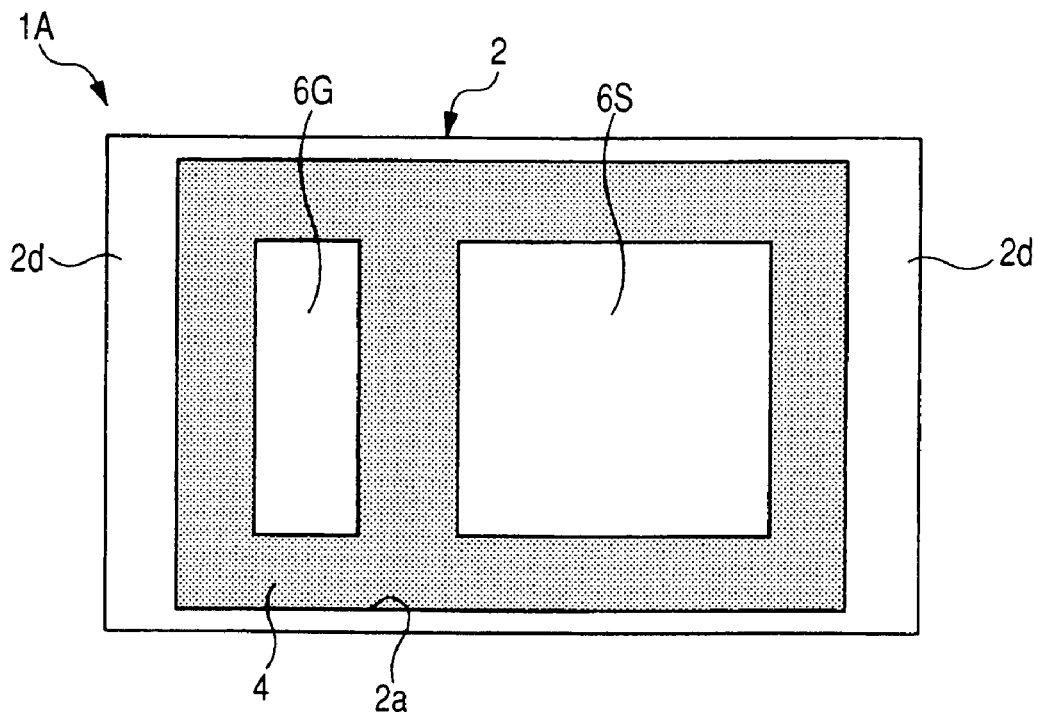
FIG. 3 is a plan view of a bottom of the semiconductor device of FIG. 1.
Figure 4:
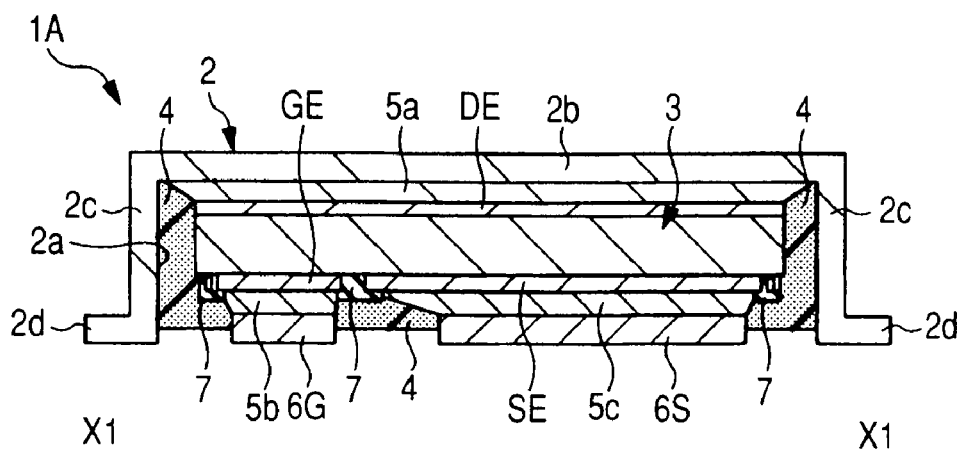
FIG. 4 is a cross section view along a line X1-X1 of the semiconductor device of FIG. 1.

FIG. 1 is a plan view of a top of a semiconductor device of embodiment 1, FIG. 2 is a side view of the semiconductor device of FIG. 1, FIG. 3 is a plan view of a bottom of the semiconductor device of FIG. 1, and FIG. 4 is a cross section view along a line X1-X1 of the semiconductor device of FIG. 1.

The semiconductor device 1A of the embodiment 1 has a metal cap (conductive cap) 2, semiconductor chip 3 housed in a recess 2a of the metal cap 2, and resin sealing body 4 for sealing the semiconductor chip 3 filled in the recess 2a of the metal cap 2.

The metal cap 2 comprises a metal having excellent electric conductivity, heat conductivity, and machinability such as copper or copper alloys, and an exposed surface of it is applied with metal plating such as palladium (Pd) plating, lead (Pb)-tin (Sn) plating, tin-silver (Ag)-copper plating, or tin plating. The metal cap 2 integrally has a first part (upper part) 2b, second part (side part) 2c, and third part (leg part) 2d.

The first part 2b of the metal cap 2 is a part forming a head of the metal cap 2 and a bottom of the recess 2a. The second part 2c of the metal cap 2 is a part forming the side part of the metal cap 2 and an inner side part of the recess 2a. The second part 2c is formed in a condition of extending from the outer circumference of the first part 2b in a direction intersecting (approximately perpendicular to) a top of the metal cap 2. The recess 2a is formed in a space (region) enclosed by the first part 2b and the second part 2c. Furthermore, the third part 2d of the metal cap 2 is a part forming the leg of the metal cap 2. That is, the third part 2d is a part forming an outer terminal for a drain of the semiconductor device 1A, and a part to be connected with an electrode of a mounting board described later. The third part 2d is formed at an end at a side distant from the first part 2b of the second part 2c.

The semiconductor chip 3 is a device body part in which a power transistor such as power MIS FET (Metal Insulator Semiconductor Field Effect Transistor) is formed, and has a first surface (top) and a second surface (bottom), which are positioned at sides opposed to each other in a thickness direction. The first surface of the semiconductor chip 3 is located at a side of the head of the metal cap 2 (bottom of the recess 2a). On the other hand, the second surface of the semiconductor chip 3 is located at a side of the leg (mounting surface of the semiconductor device 1A) of the metal cap 2. A drain electrode (upper electrode) DE is disposed on the first surface of the semiconductor chip 3, and a gate electrode (first lower electrode) GE and a source electrode (second lower electrode) SE are disposed on the second surface of the semiconductor chip 3. That is, the semiconductor chip 3 is in a configuration where the semiconductor chip 3 can radiate heat generated during operation of the chip from both the first surface and the second surface, which are located oppositely to each other. Thermal expansion coefficient of the semiconductor chip 3 is, for example, about 3.0 to 3.5 ppm/° C.

The drain electrode DE of the semiconductor chip 3 is a drain electrode of the power MOS FET, and bonded and electrically connected to the bottom (first part 2b) of the recess 2a of the metal cap 2 via a connecting material (connection material for connection the cap) 5a.

The gate electrode GE of the semiconductor chip 3 is a gate electrode of the power MOS FET. A surface of the gate electrode GE, which faces the mounting board, is disposed in a plane different from the surface of the third part 2d of the metal cap 2, which faces the mounting board, and disposed with being displaced in a direction approaching the bottom of the recess 2a with respect to a position of the surface of the third part 2d, which faces the mounting board. The gate electrode GE is bonded and electrically connected to a metal plate terminal for gate (first outer connection terminal) 6G via a connection material (first connection material) 5b.

The source electrode SE of the semiconductor chip 3 is a source electrode of the power MOS FET. A surface of the source electrode SE, which faces the mounting board, is disposed in a plane different from the surface of the third part 2d of the metal cap 2, which faces the mounting board, and disposed with being displaced in a direction approaching the bottom of the recess 2a with respect to the position of the surface of the third part 2d, which faces the mounting board. The source electrode SE is bonded to a metal plate terminal for source (second outer connection terminal) 6S via a connection material (second connection material) 5c.

The metal plate terminals 6G, 6S comprise a metal having excellent electric conductivity, heat conductivity, and machinability such as copper or copper alloys, and an exposed surfaces of them are applied with metal plating similarly as that applied on the surface of the metal cap 2. Thickness of the metal terminals 6G, 6S is, for example, about 0.1 to 0.5 mm. The thermal expansion coefficient of the metal terminals 6G, 6S is, for example, about 16 to 17 ppm/° C. The metal plate terminal for gate 6G is an outer terminal for gate of the semiconductor device 1A, and the metal plate terminal for source 6S is an outer terminal for source of the semiconductor device 1A; and surfaces of the metal plate terminals 6G, 6S, which face the mounting board, are disposed in the same plane as the surface of the third part 2d of the metal cap 2, which faces the mounting board. That is, the semiconductor device 1A of the embodiment 1 is formed in a surface mounting structure having the third part 2d for drain terminal, the metal plate terminal 6G for gate terminal and the metal plate terminal 6S for source terminal on a back of the semiconductor device 1. A plane unit of the metal plate terminal 6S is larger than that of the metal plate terminal 6G.

Here, in the case of the package configuration where the gate electrode GE and source electrode SE of the semiconductor chip 3 are directly used as outer terminals (outer connection terminals) without providing metal plate terminals 6G, 6S, as the patent literature 1, there is a problem that the outer terminals for the gate and source of the semiconductor device vary depending on the chip size of the semiconductor chip or the positions or size of the gate and source electrodes of the semiconductor chip. That is, in the case that the gate and source electrodes of the semiconductor chip are formed directly as the outer terminals for the gate and source of the semiconductor device, even in the same semiconductor device, when the semiconductor chip varies, the positions or size of the outer terminals for the gate and source of the semiconductor device may also vary.

On the contrary, in the embodiment 1, the gate electrode GE and source electrode SE of the semiconductor chip 3 are provided with the metal plate terminal for gate 6G and the metal plate terminal for source 6S via the connection materials 5b, 5c, and the terminals are used as outer terminals of the semiconductor device 1, and then positions, shapes, and size of the metal plate terminals 6G, 6S are defined (made versatile), which makes it possible that even if the chip size of the semiconductor chip 3 and the positions and size of the gate electrode GE and source electrode SE of the semiconductor chip 3 vary, the positions, shapes, and size of the outer terminals of the semiconductor 1A do not vary, or constant. That is, the outer terminals of the semiconductor 1A can be provided with versatility.

In the method where a metal strip is ultrasonic-bonded to an electrode of the semiconductor chip, since the metal strip is subjected to ultrasonic vibration in a heated condition for metal-to-metal bonding, large force is applied to the semiconductor chip, as a result the semiconductor chip, which is formed from weak semiconductor, may be cracked or broken, consequently the power MIS FET may be concernedly damaged. On the contrary, in the embodiment 1, since the metal plate terminals 6G, 6S are bonded via the connection materials 5b, 5c, large force is not applied to the semiconductor chip 3 during bonding the metal plate terminals 6G, 6S. Therefore, when the metal plate terminals 6G, 6S are bonded to the gate electrode GE and source electrode SE of the semiconductor chip 3, the semiconductor chip 3 may not be cracked or broken, and the power MIS FET may not be damaged.

The connection members 5a to 5c are formed from adhesive such as silver (Ag) paste. A brazing material such as high-lead (Pb)-tin (Sn) solder having a melting point of at least 260° C. or gold (Au) can be used as another material for the connection members 5a to 5c. The connection members 5a to 5c have the same melting point. The connection members 5b and 5c are formed by coating in the same process as described later, and therefore comprise the same material and have the same thickness. The connection member 5a has a large thickness compared with the connection members 5b and 5c.

The resin sealing body 4 comprises, for example, a phenol-based curing agent, silicone rubber, and an epoxy-based thermosetting resin added with filler, and is filled in the recess 2a of the metal cap 2 such that it covers approximately all the exposed part of the semiconductor chip 3 (including the side face of the semiconductor chip 3, the connection material 5a, a second surface side of the semiconductor chip 3, and the connection materials 5b, 5c), but does not cover bottoms (mounting surfaces) of the metal plate terminals 6G, 6S forming the outer terminals for the gate and the drain.

Here, when the semiconductor chip 3 is not sealed by resin, or kept bare, a problem of environmental-stress resistance such as leakage defect or corrosion may occur. An example of the leakage defect includes a defect of short-circuit defect, that is, since an n-type or p-type semiconductor region is sometimes exposed particularly at an outer circumferential corner of the semiconductor chip 3, the semiconductor region may contact to the metal cap 2 or an electrode portion through conductive foreign materials and the like, leading to the defect of short circuit (area short). Therefore, the semiconductor chip 3 is preferably sealed by resin, however, in the case of the package configuration where the gate electrode GE and source electrode SE of the semiconductor chip 3 are directly used as the outer terminals without providing the metal plate terminals 6G, 6S, as the patent literature 1, when the semiconductor chip 3 as a whole is intended to be sealed, consequently surfaces of the gate electrode GE and the source electrode SE may be also covered, or the surfaces of the gate electrode GE and the source electrode SE may be contaminated, therefore filling control of the resin, or control of the surface level of the resin is difficult. Therefore, actually only about a side face of the semiconductor chip 3 can be covered, consequently effects on sealing can not be sufficiently obtained.

On the contrary, the embodiment 1 is in a configuration where the gate electrode GE and the source electrode SE have the metal plate terminals 6G, 6S forming the outer terminals for the gate and source of the semiconductor device 1A via the connection materials 5b, 5c as described above, and positions of the mounting surfaces of the metal terminals 6G, 6S are protruded with respect to the second surface (surface of a surface protection layer 7) of the semiconductor chip 3 by a level corresponding to thickness of the connection materials 5b, 5c and the metal terminals 6G, 6S. Thus, when the semiconductor chip 3 as a whole is covered with the resin sealing body 4, margin is given in controlling the surface level (height position of a top) of the resin sealing body 4 only by the level corresponding to the thickness of the connection materials 5b, 5c and the metal terminals 6G, 6S, which enables loosening of accuracy in filling control of the resin sealing body 4. Therefore, the semiconductor chip 3 as a whole is covered with the resin sealing body 4 without covering, with the resin sealing body 4, or contaminating the mounting surfaces of the metal terminals 6G, 6S forming the outer terminals for the gate and source of the semiconductor device 1A. Accordingly, since the problem of environmental-stress resistance such as leakage defect or corrosion can be avoided, reliability of the semiconductor device 1A can be improved compared with the structure in which the semiconductor chip 3 is not sealed by resin.

Figure 5:
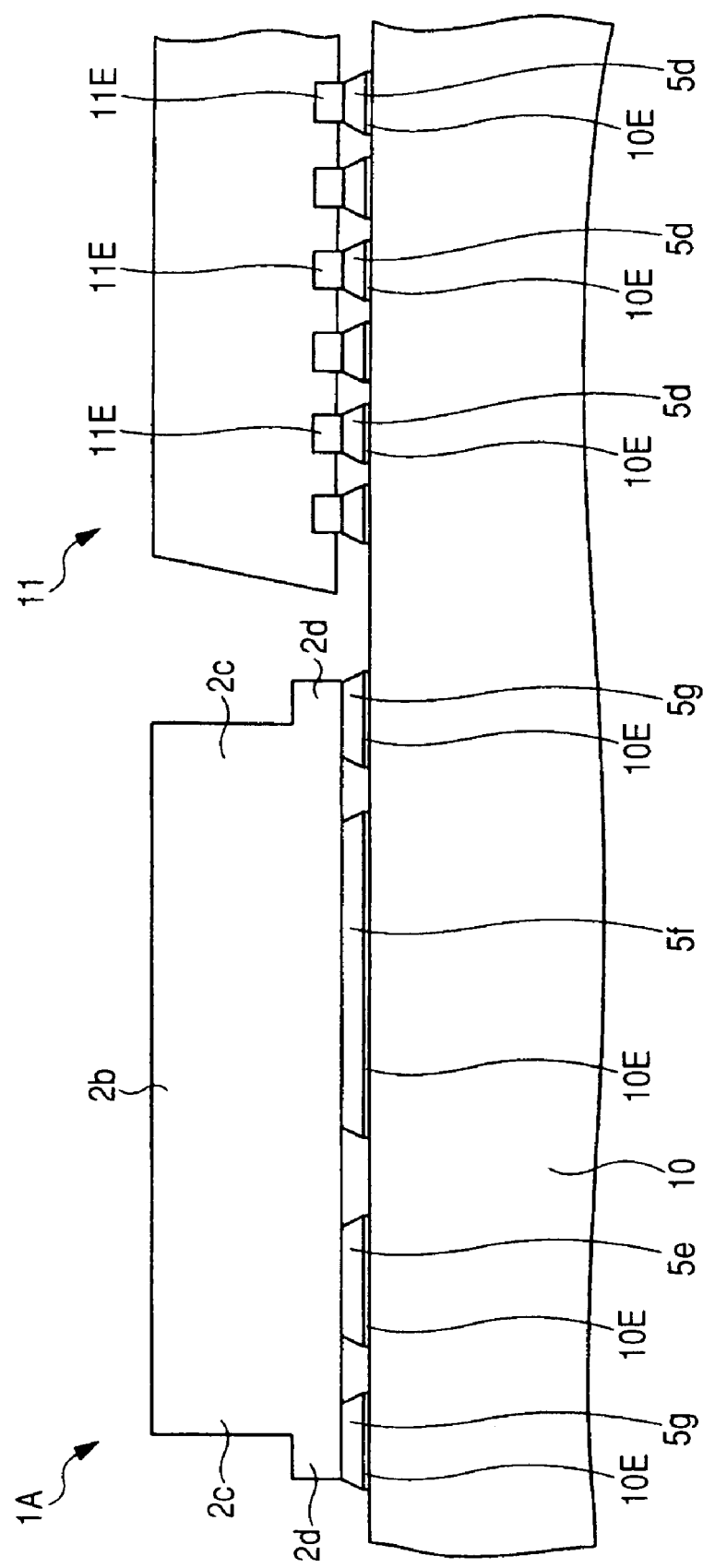
FIG. 5 is a side view showing an example of mounting the semiconductor device of FIG. 1.
Figure 6:
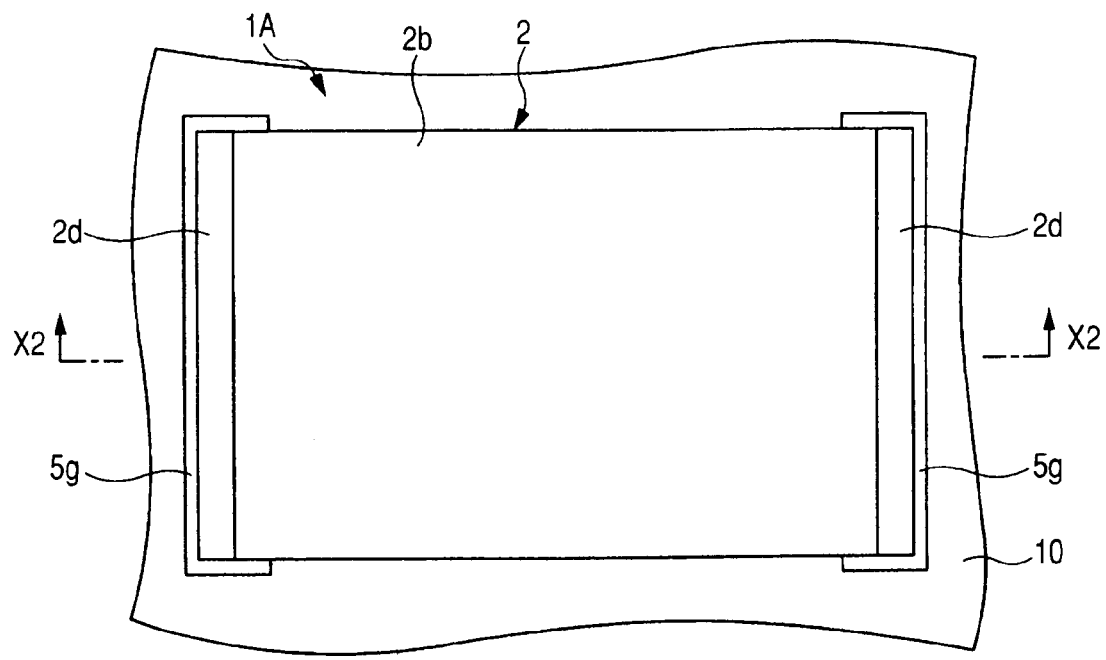
FIG. 6 is a plan view of a top during mounting the semiconductor device of FIG. 5.
Figure 7:
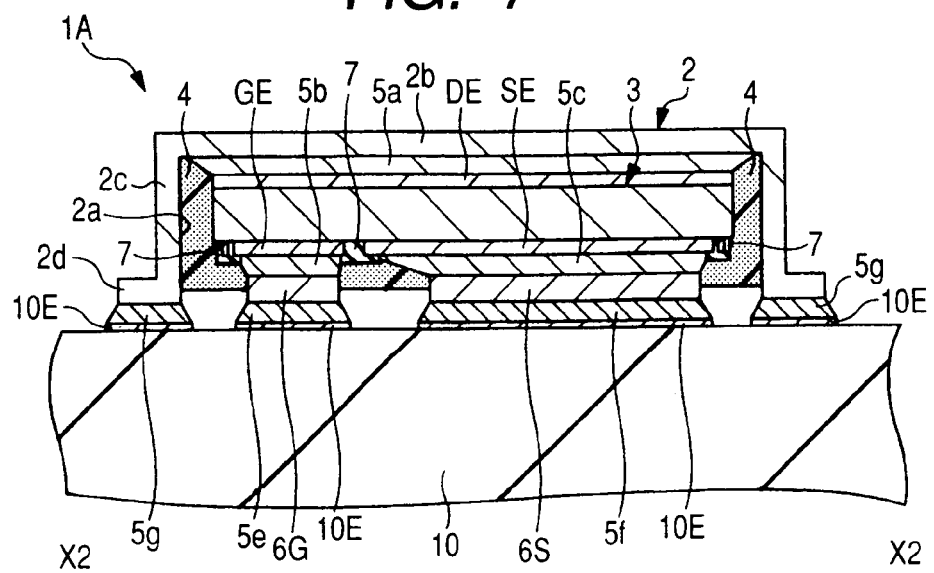
FIG. 7 is a cross section view along a line X2-X2 of the semiconductor device of FIG. 6.

Next, FIG. 5 is a side view showing an example of mounting the semiconductor device of FIG. 1, FIG. 6 is a plan view of a top of the semiconductor device of FIG. 5, and FIG. 7 is a cross section view along a line X2-X2 of the semiconductor device of FIG. 6.

A mounting board 10 is formed, for example, from a printed circuit board comprising glass epoxy resin as an insulating material among wiring layers. A plurality of electrodes 10E are disposed on a main surface of the mounting board 10. The electrodes 10E are electrically connected to one another appropriately through wiring lines within the mounting board 10. The electrodes 10E and the wiring lines comprise, for example, cupper or cupper alloys. Thermal expansion coefficient of the mounting board 10 is, for example, about 15 to 80 ppm/° C.

FIG. 5 exemplifies a case that the semiconductor device 1A of the embodiment 1 and another type of semiconductor device 11 are mounted on the main surface of the mounting board 10. The semiconductor device 11 is one having a plastic package structure of, for example, QFN (Quad Flat Non leaded Package) type, and a plurality of electrodes 11E are exposed from lower parts of four side faces of the device. The electrodes 11E are bonded and electrically connected to the electrodes 10E on the mounting board 10 via the connection materials 5d. A pitch of the electrodes 11E is made to be, for example, 0.65 mm or 0.5 mm in addition to 1.27 mm.

The metal plate terminal 6G for the gate of the semiconductor device 1A of the embodiment 1 is bonded and electrically connected to the electrodes 10E on the mounting board via the connection materials 5e (fourth connection material). The metal plate terminal 6S for the source of the semiconductor device 1A is bonded and electrically connected to the electrodes 10E on the mounting board via the connection materials 5f (fifth connection material). Furthermore, the third part 2d for the drain of the semiconductor device 1A is bonded and electrically connected to the electrodes 10E on the mounting board via the connection materials 5g (sixth connection material). That is, the semiconductor device 1A of the embodiment 1 is surface-mounted on the main surface of the mounting board 10.

The connection materials 5e, 5f and 5g comprise, for example, a soldering material having a lead-free composition, and coated in the same process as in the connection material 5d. As the soldering material having the lead-free composition, tin-silver-cupper (for example, Sn-3Ag-0.5Cu; melting point of about 217° C.), tin-zinc (for example, Sn-9Zn; melting point of about 199° C.), tin-zinc-bismuth (for example, Sn-8Zn-3Bi; melting point of about 190° C.), tin-silver-bismuth-indium (Sn-3.5Ag-0.5Bi-8In; melting point of about 206° C.), and tin-silver-cupper-indium (Sn-3Ag-0.5Cu-7In; melting point of about 206° C.) can be exemplified.

Here, in the case of the configuration where the gate electrode GE and source electrode SE of the semiconductor chip 3 are bonded to the electrodes 10E of the mounting board 10 via the connection materials as the patent literature 1, since the semiconductor chip 3 is directly connected to the mounting board 10 having a large thermal expansion coefficient compared with the semiconductor chip 3, there is a problem that large thermal stress due to difference in thermal expansion coefficient is added to connection portions for connecting the source electrode SE and gate electrode GE of the semiconductor chip 3 to the electrodes 10E of the mounting board 10, and thus thermal fatigue occurs early in the connection portions, consequently the connection portions are broken. Alternatively, the semiconductor chip 3 may be cracked.

On the contrary, in the embodiment 1, the connection portion between the gate electrode GE of the semiconductor chip 3 and the electrode 10E of the mounting board 10 is formed in a stacked configuration of the connection material 5b, metal plate terminal 6G, and connection material 5e; and the connection portion between the source electrode SE of the semiconductor chip 3 and the electrode 10E of the mounting board 10 is formed in a stacked configuration of the connection material 5c, metal plate terminal 6S, and connection material 5f. That is, the connection materials 5b, 5e are provided on and under the metal plate terminal 6G, and the connection materials 5c, 5f are provided on and under the metal plate terminal 6S. Thus, since the distance between the gate electrode GE or source electrode SE of the semiconductor chip 3, and the electrodes 10E of the mounting board 10 can be lengthened, the thermal stress applied to the connection portions for connecting the gate electrode GE and source electrode SE of the semiconductor chip 3 to the electrodes 10E of the mounting board 10 can be reduced. Moreover, as material of the metal plate terminals 6G, 6S, a metal material having a thermal expansion coefficient in the middle of the thermal expansion coefficient of the semiconductor chip 3 and the thermal expansion coefficient of the mounting board 10 is used, thereby difference in thermal expansion coefficient between members can be reduced, therefore the thermal stress applied to the connection portions for connecting the gate electrode GE and source electrode SE of the semiconductor chip 3 to the electrodes 10E of the mounting board 10 can be reduced. Consequently, break in the connection portion between the semiconductor device 1A and the mounting board 10 can be suppressed or prevented, and thus thermal fatigue life of the connection portion can be improved. In addition, cracks in the semiconductor chip 3 due to the thermal stress can be suppressed or prevented. That is, in the embodiment 1, the connection portion (connection material 5b, metal plate terminal 6G and connection material 5e) between the gate electrode GE of the semiconductor chip 3 and the electrode 10E of the mounting board 10 and the connection portion (connection material 5c, metal plate terminal 6S and connection material 5f) between the source electrode SE of the semiconductor chip 3 and the electrode 10E of the mounting board 10 have a function of buffering the thermal stress caused by difference in thermal expansion coefficient between the semiconductor chip 3 and the mounting board 10.

Here, to avoid the problem of thermal stress due to difference in thermal expansion coefficient between the semiconductor chip 3 and the mounting board 10, increase in thickness of the connection materials 5e, 5f and 5g is considered as a method for lengthening the distance between the electrodes (gate electrode GE and source electrode SE) of the semiconductor chip 3 and the electrodes of the mounting board 10. However, while it is easy if only the semiconductor device 1A is mounted on the main surface of the mounting board 10, actually another semiconductor device 11 is also mounted on the main surface of the mounting board 10 as the above, and increase in thickness of the connection materials 5d, 5e, 5f and 5g leads to increase in amount of the connection materials 5d coated on the electrodes 11E of the semiconductor device 11, which is disposed at a small pitch, the defect of short circuit among the electrodes 11E adjacent to one another possibly occurs by the connection materials 5d. Thus, while it is considered that the connection material 5d and the connection materials 5e, 5f and 5g are coated in different steps, such a process increases the number of steps, which concernedly causes increase in manufacturing time or decrease in yield due to generation of foreign substances.

On the contrary, in the embodiment 1, by providing the metal plate terminals 6G, 6S, the distance between the electrodes (gate electrode GE and source electrode SE) of the semiconductor chip 3 and the electrodes of the mounting board 10 can be lengthened without increasing thickness of the connection materials 5d, 5e, 5f and 5g. Accordingly, the thermal stress applied to the connection portions for connecting the gate electrode GE and source electrode SE of the semiconductor chip 3 to the electrodes 10E of the mounting board 10 can be reduced without causing short-circuit defect among adjacent electrodes 11E of the semiconductor device 11. Moreover, since the connection materials 5d, 5e, 5f and 5g can be coated in the same process, increase in manufacturing time due to increase in the number of steps or the decrease in yield due to generation of foreign substances can be avoided.

Figure 8:
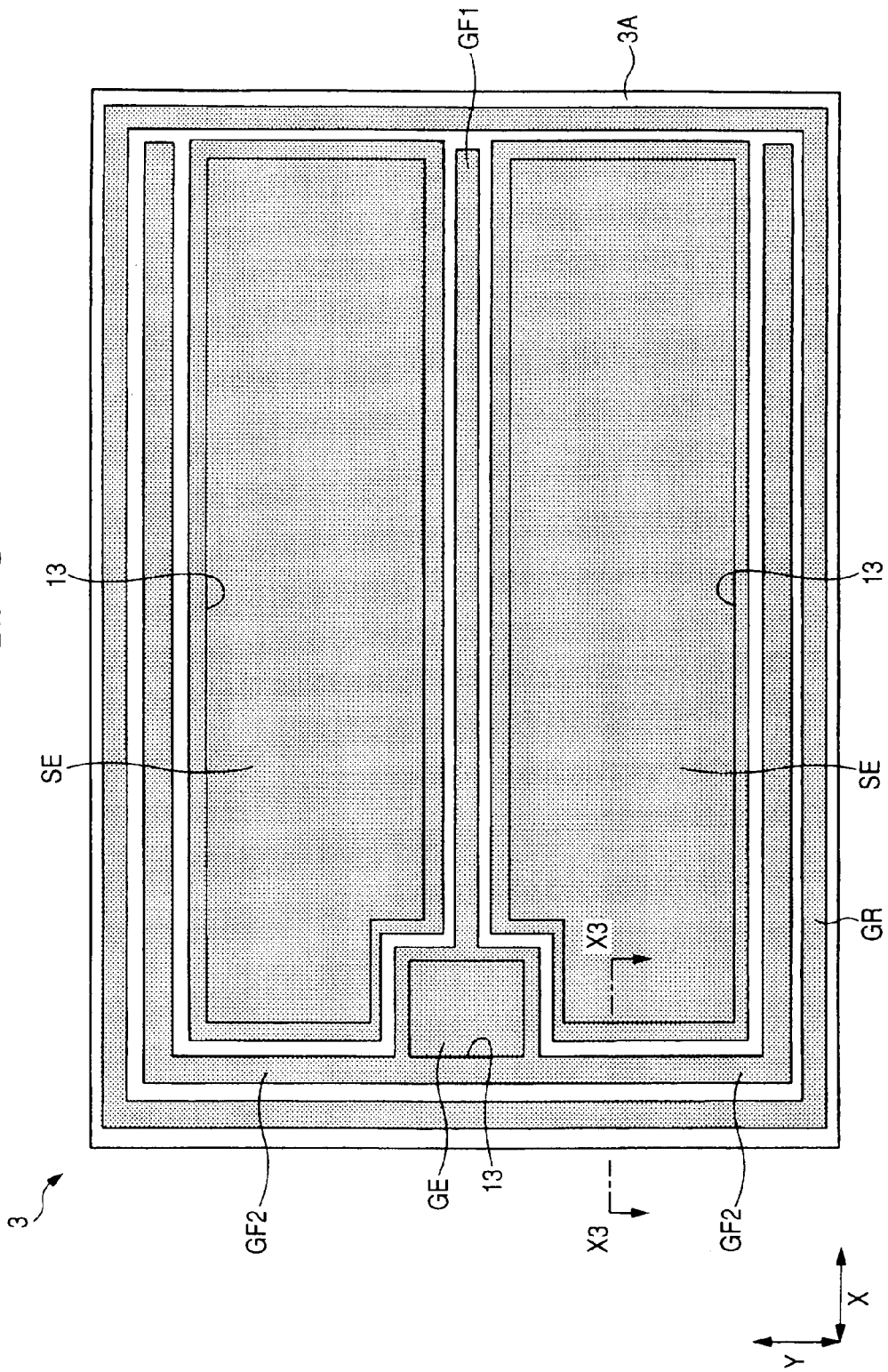
FIG. 8 is a plan view of a semiconductor chip forming the semiconductor device of FIG. 1.
Figure 9:
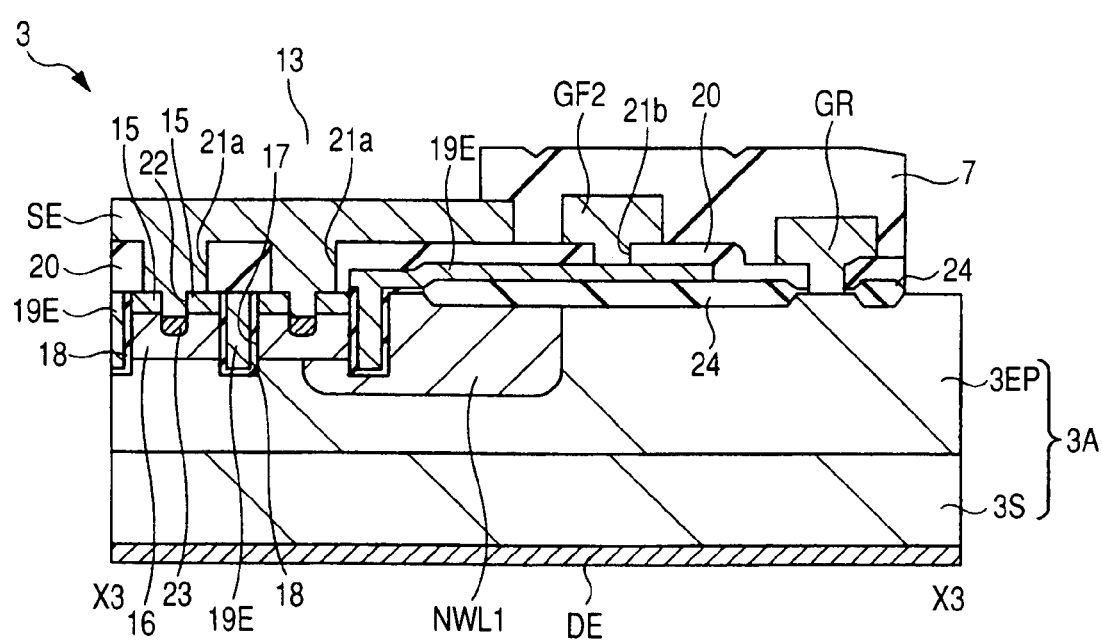
FIG. 9 is a cross section view along a line X3-X3 of the semiconductor device of FIG. 8.
Figure 10:
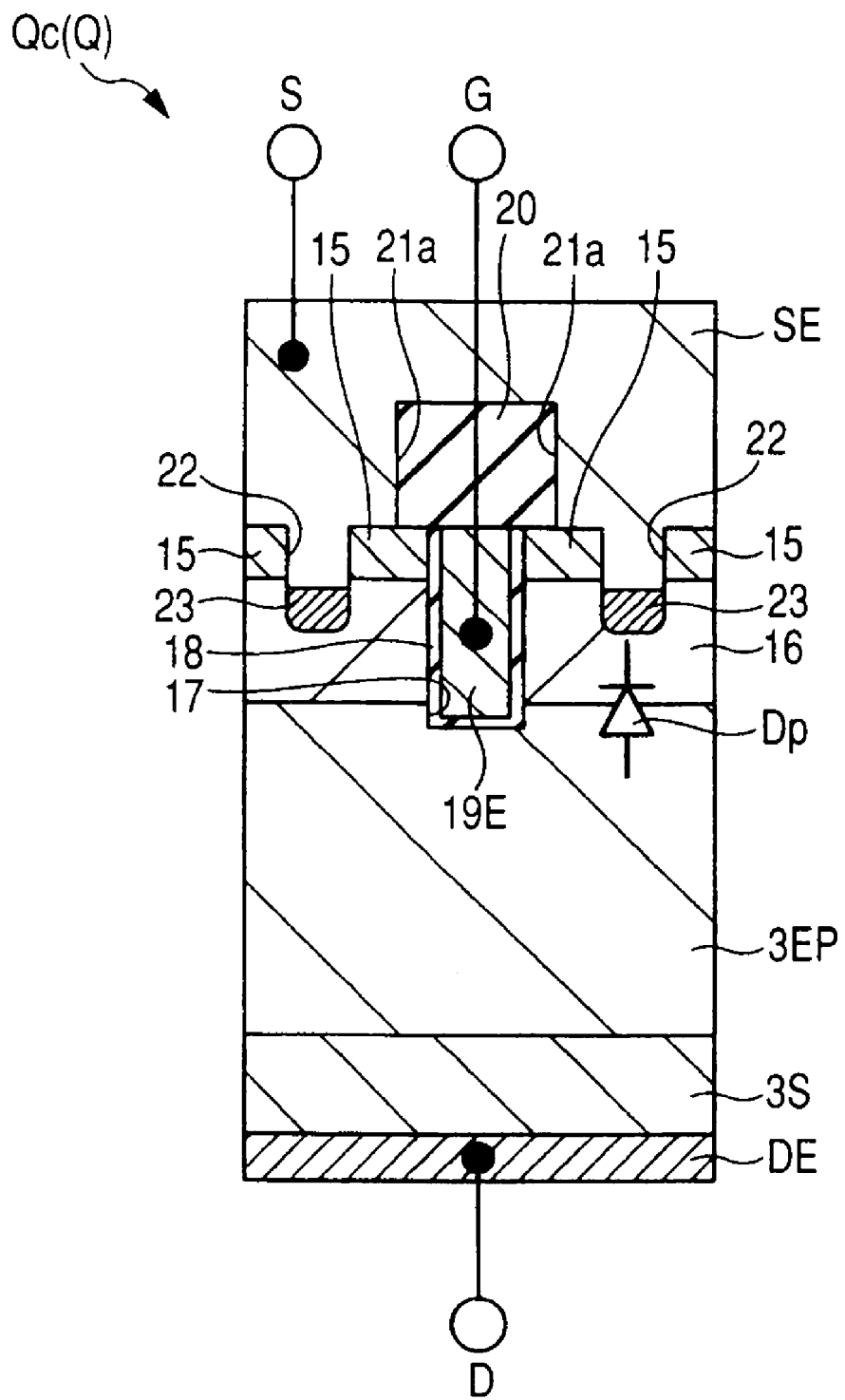
FIG. 10 is an enlarged section view of a power transistor cell of the semiconductor device of FIG. 8.

Next, an example of a configuration of the semiconductor chip 3 is described according to FIG. 8 to FIG. 10. FIG. 8 is a plan view of a semiconductor chip forming the semiconductor device of the embodiment 1, FIG. 9 is a cross section view along a line X3-X3 of the semiconductor chip of FIG. 8, and FIG. 10 is an enlarged view of a power transistor cell of the semiconductor chip of FIG. 8. A sign Y in FIG. 8 indicates a first direction, and a sign X indicates a second direction perpendicular to the first direction. Here, the first direction Y is a narrow direction of the semiconductor chip, and a longitudinal (extending) direction of a gate electrode of a power MIS FET (Metal Insulator Semiconductor Field Effect Transistor). The second direction X is a longitudinal direction of the semiconductor chip, and a narrow direction of the gate electrode of the power MIS FET. In FIG. 10, a sign G indicates a gate of the power MIS FET, a sign S indicates a source of the power MIS FET, and a sign D indicates a drain of the power MIS FET.

The semiconductor chip 3 is formed, for example, in a flat and rectangular shape. A semiconductor substrate (hereinafter, simply called substrate) 3A for forming the semiconductor chip 3 has a substrate part 3S and an epitaxial layer 3EP formed on a main surface thereof. The substrate part 3S comprises, for example, $n^+$-type silicon (Si) single-crystal, and the epitaxial layer 3EP comprises n-type silicon single-crystal having higher resistivity than that of the substrate part 3S.

The substrate 3A has the first and second surfaces as surfaces opposite to each other in a thickness direction of the substrate. The first surface of the substrate 3A is a bottom of the substrate part 3S, and a drain electrode DE comprising, for example, gold (Au) as a main electrode material is disposed entirely on the first surface of the substrate 3A. The drain electrode DE is formed by stacking, for example, titanium (Ti), nickel (Ni) and gold in this order on the first surface of the substrate part 3S. On the other hand, the second surface of the substrate 3A is a top of the epitaxial layer 3EP, and a gate electrode GE, gate fingers GF1, GF2, a source electrode SE, and a guard ring GR comprising, for example, aluminum (Al) or aluminum alloys as a main electrode material are disposed as the uppermost wiring layer on the second surface of the substrate 3A.

The gate electrode GE is a lead electrode for the gate of the power MIS FET, and disposed near a side of one end in the second direction X of the semiconductor chip 3 and at approximately the middle in the first direction Y. The gate electrode GE is formed integrally with the gate fingers GF1, GF2. One gate finger GF1 extends from the gate electrode GE near the one end side of the semiconductor chip 3 in the second direction X to a side of the other end of the semiconductor chip 3 in the second direction X at the middle in the first direction Y such that the semiconductor chip 3 is divided into upper and lower halves. The other gate finger GF2 extends from the gate electrode GE near the one end side of the semiconductor chip 3 in the second direction X to neighborhood of the outer circumference of the semiconductor chip 3 along the outer circumference, and terminates at a side of the other end of the semiconductor chip 3 in the second direction X.

The source electrodes SE are lead electrodes for the source of the power MIS FET, and disposed in upper and lower areas of the central gate finger GF1 each. Respective source electrodes SE are isolated from the gate electrode GE and the gate fingers GF1, GF2. Respective source electrodes SE have the same planar shape and size, and are disposed such that they are symmetrical with respect to the gate finger GF1. Respective source electrodes SE are made as a rectangular pattern elongated in the second direction X, and formed such that a planer dimension of them is larger than that of the gate electrode GE.

The surface protection layer 7 is formed as the uppermost insulating layer on the main surface of the semiconductor chip 3 such that it covers the gate electrode GE, gate fingers GF1, GF2, source electrodes SE, and guard rings GR. Openings 13 are formed in part of the surface protection layer 7, and the gate electrode GE and the source electrode SE are partially exposed from the openings 13. The gate electrode GE and the source electrode SE exposed from the openings 13 are connected with the connection materials 5b, 5c.

In an element formation region enclosed by the gate fingers GF1, GF2 on the main surface of the semiconductor chip 3, multiple small cells Qc are disposed with being connected parallel to one another to obtain high power. As the cells Qc, a power MIS FET having a trench gate configuration (vertical type) is exemplified. Configuration of the cell Qc of the power MIS FET having the trench gate configuration is described.

The cell Qc is formed from an n-channel type, field effect transistor, and has an $n^+$-type semiconductor region 15 for source provided on the epitaxial layer 3EP on the main surface of the substrate 3A, a semiconductor region for drain formed by the $n^+$-type substrate part 3S at a back side of the substrate 3A and the n-type epitaxial layer 3EP, and a p-type semiconductor region 16 for channel formation provided on the epitaxial layer 3EP between the regions. The semiconductor region 15 contains, for example, phosphorus (P) or arsenic (As), and the semiconductor region 16 contains, for example, boron (B).

A plurality of trenches (first trench) 17a extending in a direction perpendicular to the main surface of the substrate 3A are formed on the main surface (second surface) of the substrate 3A. Each of the trenches 17a is formed such that it penetrates the semiconductor region 15 for source and the semiconductor region 16 for channel formation from the main surface of the substrate 3A and terminates at the semiconductor region for drain (here, epitaxial layer 3EP).

Gate electrodes 19E are provided within the trenches 17a via gate insulating films 18. The gate insulating films 18 comprise, for example, silicon oxides ($SiO_2$ and the like), and has a thickness of, for example, about 50 nm. The gate electrodes 19E are control electrodes applied with voltage for controlling operation of the power MIS FET, and comprise, for example, low resistant, polycrystalline silicon. Channels of the cells Qc of the power MIS FET are formed in the semiconductor regions 16 for channel formation opposed to side faces of the gate electrodes 19E in the trenches 17a. That is, channel current of the cell Qc of the power MIS FET flows in a thickness direction of the substrate 3A perpendicular to the main surface of the substrate 3A along a side face of the trench 17a. The sign DP in FIG. 10 indicates a parasitic diode.

An interlayer insulating layer 20 is formed on the gate electrode 19E. The interlayer insulating layer 20 comprises, for example, a silicon oxide, and part of the outer circumference of the layer covers over a top of the semiconductor region 15 for source. The source electrode SE is formed on the interlayer insulating layer 20. The source electrode SE is formed in a stacking configuration of a relatively thin barrier metal layer and a relatively thick metal layer deposited thereon. The barrier metal layer comprises, for example, titanium tungsten (TiW), and the thick metal layer thereon comprises, for example, aluminum or aluminum alloys.

The source electrode SE is contacted and electrically connected to the top of the semiconductor region 15 for source of the power MIS FET through a contact hole 21a perforated in the interlayer insulating layer 20, the top being exposed from the hole. A trench (second trench) 22, which extends in a direction perpendicular to the main surface (second surface) of the substrate 3A, and penetrates the semiconductor region 15 for source and terminates at the semiconductor region 16 for channel formation, is formed on the substrate 3A at a bottom of the contact hole 21a. The source electrode SE is contacted and electrically connected to the semiconductor region 15 for source through the side face of the trench 22, and connected to a $p^+$-type semiconductor region 23 at a bottom of the trench 22, and therethrough electrically connected to the semiconductor region 16 for channel formation. The p⁺-type semiconductor region 23 contains, for example, boron.

The gate electrodes 19E are disposed, for example, in a stripe type. That is, a plurality of gate electrodes 19E extending in the first direction Y are disposed along the second direction X in an arranged manner on the main surface of the semiconductor chip 3. The gate electrodes 19E are formed integrally with gate wiring lines 19L and electrically connected thereto. The gate wiring lines 19L comprise, for example, low resistant, polycrystalline silicon, and led out onto insulating layers 24 for isolation of the outer circumference of a group of the cells Qc. The insulating layers 24 for isolation comprise, for example, silicon oxides ($SiO_2$ and the like). While the gate wiring lines 19L are covered with the interlayer insulating layers 20 in isolation regions, they are electrically connected to the gate fingers GF1, GF2 through contact holes 21b perforated in the interlayer insulating layers 20, and therethrough electrically connected to the gate electrode GE. That is, the gate electrode GE is electrically connected to the gate electrodes 19E through the gate fingers GF1, GF2 and the gate wiring lines 19L.

As shown in FIG. 9, an outer circumferential corner (corner formed at a crossing portion between the side face of the semiconductor chip 3 and the second surface) of the semiconductor chip 3 is sometimes bared. Therefore, unless the corner is covered with the resin sealing body 4, the problem of leakage defect tends to occur. On the contrary, in the embodiment 1, the outer circumferential corner of the semiconductor chip 3 is also covered with the resin sealing body 4 as described above. Thus, since the problem on the environmental-stress resistance such as leakage defect and corrosion can be avoided, reliability of the semiconductor device 1A can be improved compared with the structure where the semiconductor chip 3 is not sealed by resin.

Figure 11:
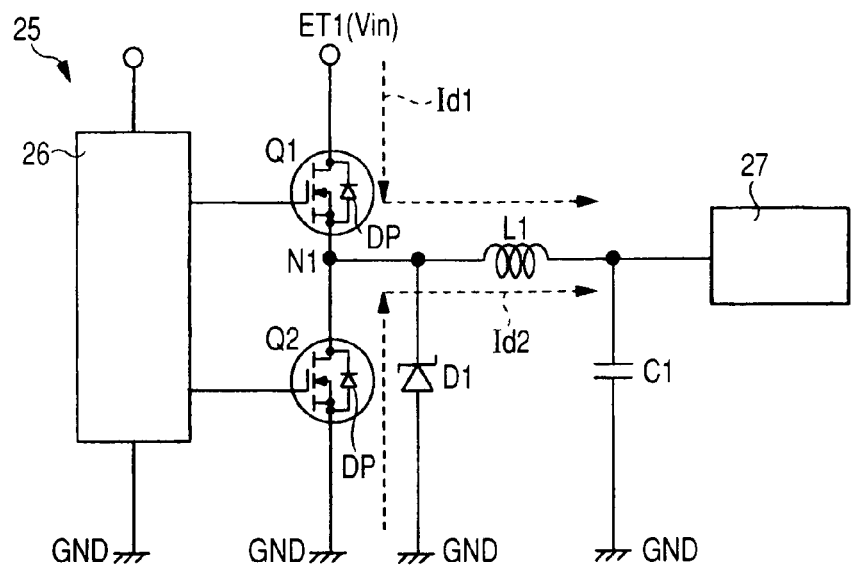
FIG. 11 is a circuit diagram of an example of a non-insulated DC-DC converter formed using the semiconductor device of FIG. 1.

Next, an example of a circuit configured using the semiconductor device 1A of the embodiment 1 is described. FIG. 11 shows an example of a non-insulated DC-DC converter 25 configured using the semiconductor device 1A of the embodiment 1. The non-insulated DC-DC converter 25 is a power conversion circuit used in a power circuit of an electronic device such as desktop personal computer, laptop computer, server, or game machine, and has a control circuit 26, power MIS FETs (first and second, field effect transistors) Q1 and Q2, SBD (Schottky Barrier Diode) D1, and an element such as coil L1 and condenser C1.

The control circuit 26 is a circuit that supplies a signal for controlling width of voltage-switch-ON (ON-time) of the power MIS FETs Q1, Q2, including a pulse width modulation (PWM) circuit. Output (terminal for control signal) of the control circuit 26 is electrically connected to gates of the power MIS FETs Q1, Q2 via driver circuits. The driver circuits are circuits that control gate potential of the power MIS FETs Q1, Q2 according to the control signals supplied from the control circuit 26 in order to control operation of the power MIS FETs Q1, Q2. The driver circuits are formed, for example, from CMOS inverter circuits.

The power MIS FETs Q1, Q2 are connected in series between a terminal (first power terminal) ET1 for supplying input power potential (first power potential) Vin and a terminal (second power terminal) for supplying reference potential (second power potential) GND. That is, the power MIS FET Q1 is provided such that a source/drain channel of it is connected in series between the terminal ET1 and an output node (output terminal) N1, and the power MIS FET Q2 is provided such that a source/drain channel of it is connected in series between the output node N1 and the terminal for supplying ground potential GND. Configurations of the power MIS FETS Q1, Q2 are assumed as the configuration of the semiconductor device 1A of the embodiment 1. The input power potential Vin is, for example, 5 to 12 V. The reference potential GND is, for example, power potential lower than the input power potential, and for example, ground potential or 0 (zero) V. Operation frequency (frequency at turning on and off the power MIS FETs Q1, Q2) of the non-insulated DC-DC converter 25 is, for example, about 1 MHZ.

The power MIS FET Q1 is a power transistor for a high side switch (high potential side; first operation voltage), and has a switch function for storing energy into the coil L1 that supplies power to the output of the non-insulated DC-DC converter 25 (input of a load circuit 27). The power MIS FET Q1 is formed from a vertical-type field effect transistor in which a channel is formed in a thickness direction of a chip. According to investigation of the inventor, in the power MIS FET Q1 for high side switch, switching loss (turn-on loss and turn-off loss) appears to be increased due to parasitic capacitance added to the power MIS FET as the operation frequency of the non-insulated DC-DC converter 25 increases. Therefore, in a usual case, a horizontal-type field effect transistor in which a channel is formed along a main surface of the chip (surface in a direction perpendicular to the thickness direction of the chip) is desirably used as the field effect transistor for high-side switch in the light of the switching loss. The reason for this is because parasitic capacitance added between the gate and the drain (gate parasitic capacitance) can be reduced in the horizontal-type field effect transistor, since an overlapped area between the gate electrode and the drain region is small compared with the vertical-type field effect transistor. However, regarding resistance (ON-resistance) generated during operation of the horizontal-type field effect transistor, when a value that is about same as in the vertical-type field effect transistor is intended to be obtained, a cell area of the horizontal-type field effect transistor must be made large about two and half times or more of that of the vertical-type field effect transistor, which is disadvantageous for reduction in size of an element. On the contrary, in the case of the vertical-type field effect transistor, channel width per unit area can be increased compared with the horizontal-type field effect transistor, and thereby ON-resistance can be reduced. That is, the power MIS FET Q1 for high-side switch is formed from the vertical-type field effect transistor, thereby reduction in size of an element can be realized, and package can be reduced in size.

Figure 12:
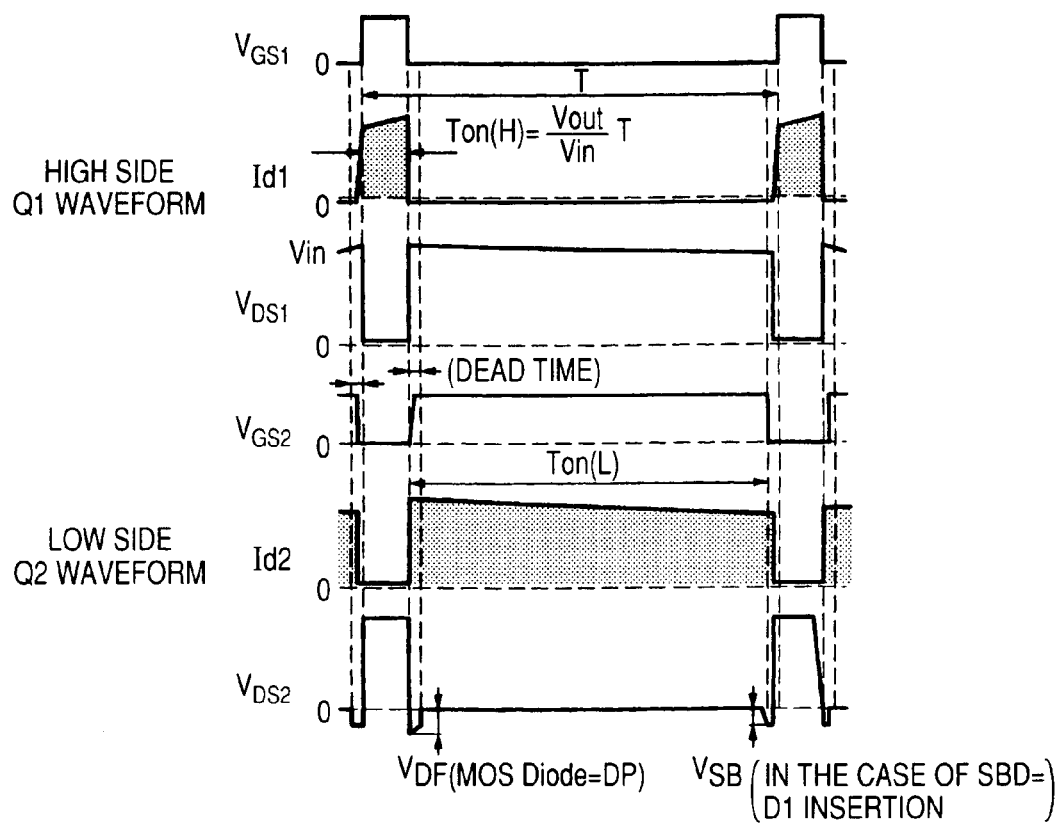
FIG. 12 is a timing chart of an example of a signal of the non-insulated DC-DC converter of FIG. 11.

On the other hand, the power MIS FET Q2, which is a power transistor for a low-side switch (low potential side: second operation voltage), is a transistor for rectification of the non-insulated DC-DC converter 25, and has a function of performing rectification by decreasing resistance of the transistor in synchronization with a frequency from the control circuit 26. The power MIS FET Q2 is formed from the vertical-type power MIS FET in which the channel is formed in the thickness direction of the chip similarly as the power MIS FET Q1. This is because of, for example, the following reason. FIG. 12 shows an example of a timing chart of a signal of the non-insulated DC-DC converter 25. Ton indicates pulse width while the power MIS FET Q1 for high-side switch is in an ON-state, and T indicates a pulse cycle. As shown in FIG. 12, in the power MIS FET Q2 for low-side switch, ON-time (time period while voltage is applied) is longer than that of the power MIS FET Q1 for high-side switch. Therefore, since loss due to ON-resistance looks large rather than the switching loss in the power MIS FET Q2, use of the vertical-type field effect transistor in which channel width per unit area can be increased compared with the horizontal-type field effect transistor is advantageous, which is the reason for the above. That is, the power MIS FET Q2 for low-side switch is formed from the vertical-type field effect transistor, thereby the ON-resistance can be decreased, therefore even if current flowing into the non-insulated DC-DC converter 25 is increased, voltage conversion efficiency can be improved. In FIG. 12, VGS1 indicates voltage between the gate and source of the power MIS FET Q1, Id1 indicates drain current (channel current) of the power MIS FET Q1, VDS1 indicates voltage between the source and drain of the power MIS FET Q1, VGS2 indicates voltage between the gate and source of the power MIS FET Q2, Id2 indicates drain current (channel current) of the power MIS FET Q2, and VDS2 indicates voltage between the source and drain of the power MIS FET Q2.

In the non-insulated DC-DC converter 25 of FIG. 11, the output node N1 for externally supplying the output power potential is provided in the middle of a wiring line connecting between the source of the power MIS FET Q1 and the drain of the power MIS FET Q2. The output node N1 is electrically connected to the coil L1 via an output wiring line, and in turn electrically connected to the load circuit 27 via the output wiring line.

The SBDD1 is electrically connected between the output wiring line for connecting the output node N1 to the coil L1 and a terminal for supplying reference potential GND such that it is parallel to the power MIS FET Q2. The SBDD1 is a diode in which forward voltage Vf is lower than that of the parasitic diode DP of the power MIS FET Q2. In the SBDD1, an anode is electrically connected to the terminal for supplying reference potential GND, and a cathode is electrically connected to the output wiring line for connecting between the coil L1 and the output node N1. By connecting the SBDD1 in such a manner, voltage drop during dead time (see FIG. 12) when the power MIS FET is turned off is reduced, conduction loss in the diode can be decreased, and diode recovery loss can be decreased due to decrease in time of reverse recovery.

The condenser C1 is electrically connected between the output wiring line for connecting the coil L1 to the load circuit 27 and the terminal for supplying reference potential GND. As the load circuit 27, CPU (Central Processing Unit) or DSP (Digital Signal Processor) of the electronic device can be exemplified.

Such a non-insulated DC-DC converter 25 performs conversion of power voltage by alternately switching on and off with being synchronized by the power MIS FETs Q1, Q2. That is, when the power MIS FET Q1 for high-side switch is in the ON state, drain current (first current) Id1 flows from a terminal ET1 electrically connected to the drain of the power MIS FET Q1 to the output node N1 through the power MIS FET Q1; and when the power MIS FET Q1 for high-side switch is in a OFF state, drain current Id2 flows due to counter electromotive voltage of the coil L1. The power MIS FET Q2 for low-side switch is turned on during flowing of the drain current Id2, thereby voltage drop can be reduced. The drain current Id1 is large current, for example, about 20 A. A level of loss in such a non-insulated DC-DC converter 25 is larger in the order of ON-resistance loss, which is the largest, switching loss, drive loss, dead-time diode loss, and others; therefore decrease in ON-resistance extremely contributes to improvement in efficiency.

Next, an example of a method for manufacturing the semiconductor device 1A of the embodiment 1 is described according to FIG. 13 to FIG. 19. The upper of each of FIG. 13 to FIG. 19 is a plan view of a bottom (leg) side of the semiconductor device 1A during a manufacturing process, and the lower is a cross section view along a line X4-X4 of the upper each.

Figure 13:
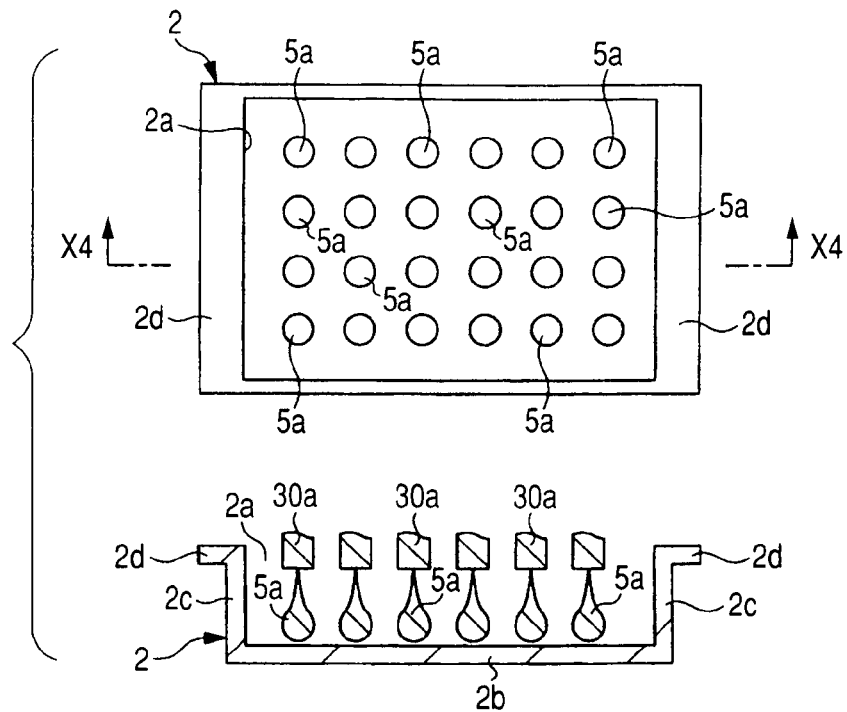
FIG. 13 is views, wherein the upper is a plan view of the semiconductor device of FIG. 1 during a manufacturing process, and the lower is a cross section view along a line X4-X4 of the upper.

First, as shown in FIG. 13, the connection material 5a is coated on the bottom of the recess 2a of the metal cap 2 through a nozzle 30a (coating process of connection material for cap connection). The connection material 5a uses adhesive such as silver paste or a brazing material such as high-lead/tin solder. While a method of coating the connection material 5a using the nozzles 30a is exemplified here, the method is not limited to this, for example, the connection material 5a can be coated by a printing method.

Figure 14:
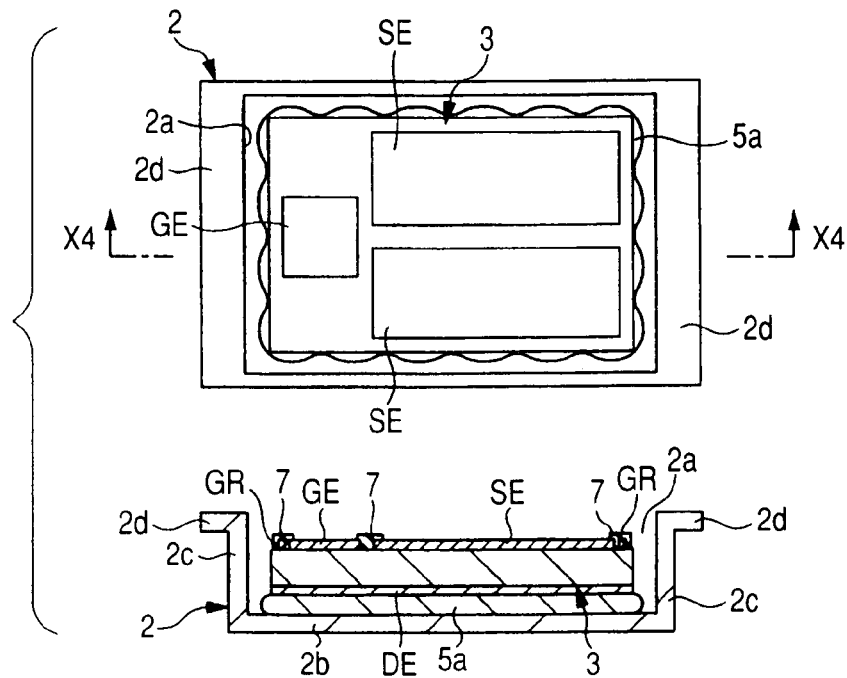
FIG. 14 is views showing a manufacturing step of the semiconductor device following FIG. 13, wherein the upper is a plan view of the semiconductor device during the manufacturing process, and the lower is a cross section view along a line X4-X4 of the upper.

Then, as shown in FIG. 14, the semiconductor chip 3 is mounted on the bottom of the recess 2a of the metal cap 2 via the connection material 5a (semiconductor chip mounting process). At that time, the first surface of the semiconductor chip 3 on which the drain electrode DE was formed is directed to the bottom of the recess 2a of the metal cap 2, and the drain electrode DE of the semiconductor chip 3 is lightly pressed to the bottom of the recess 2a of the metal cap 2 via the connection material 5a.

Figure 15:
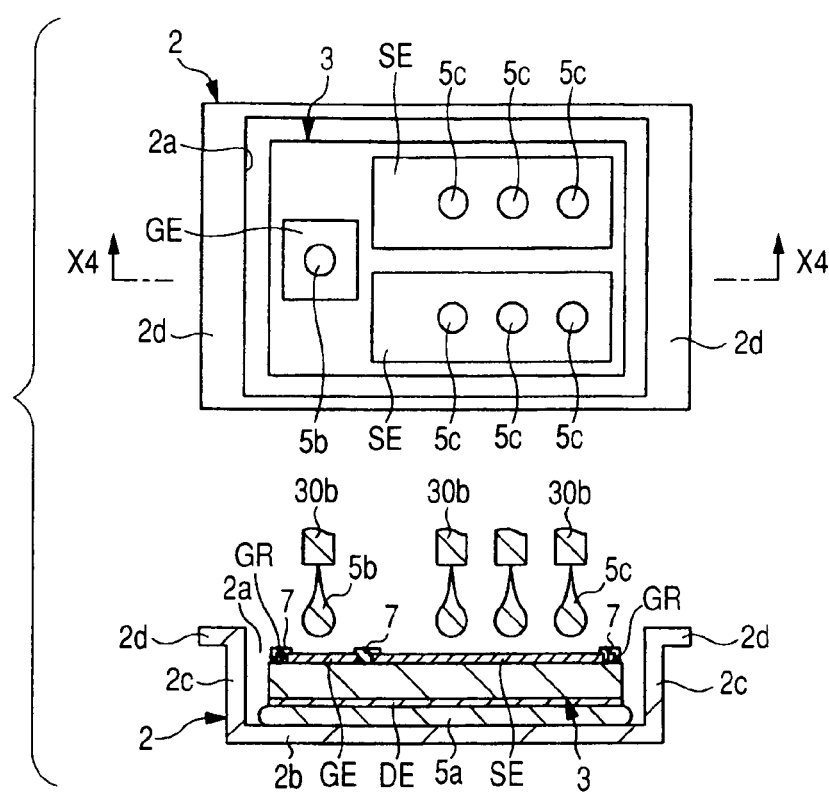
FIG. 15 is views showing a manufacturing process of the semiconductor device following FIG. 14, wherein the upper is a plan view of the semiconductor device during the manufacturing process, and the lower is a cross section view along a line X4-X4 of the upper.

After that, as shown in FIG. 15, connection materials 5b, 5c are coated on tops of the gate electrode GE and the source electrode SE of the semiconductor chip 3 through a nozzle 30b (coating process of first and second connection materials). The connection materials 5b, 5c use the adhesive such as silver paste or the brazing material such as high-lead/tin solder.

Figure 16:
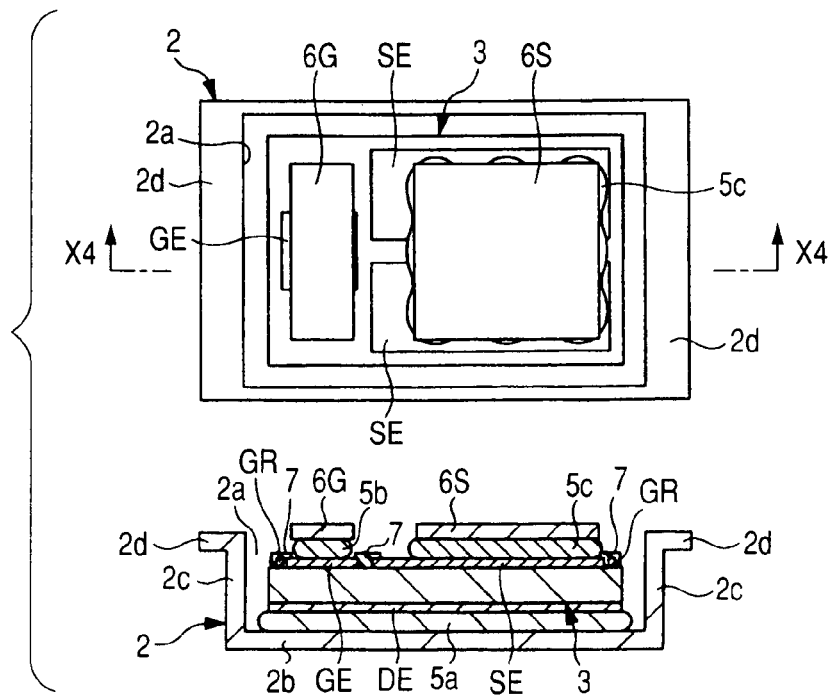
FIG. 16 is views showing a manufacturing process of the semiconductor device following FIG. 15, wherein the upper is a plan view of the semiconductor device during the manufacturing process, and the lower is a cross section view along a line X4-X4 of the upper.

Then, as shown in FIG. 16, metal plate terminals 6G, 6S are mounted on the tops of the gate electrode GE and the source electrode SE of the semiconductor chip 3 via the connection materials 5b, 5c respectively (mounting process of terminal for external connection). The metal plate terminals 6G, 6S comprise, for example, cupper or cupper alloys as a main material; and herein, as shown in the lower of FIG. 16, a case where mounting surfaces of the metal plate terminals 6G, 6S project upward with respect to the mounting surface of the third part 2d of the metal cap 2 is exemplified.

Figure 17:
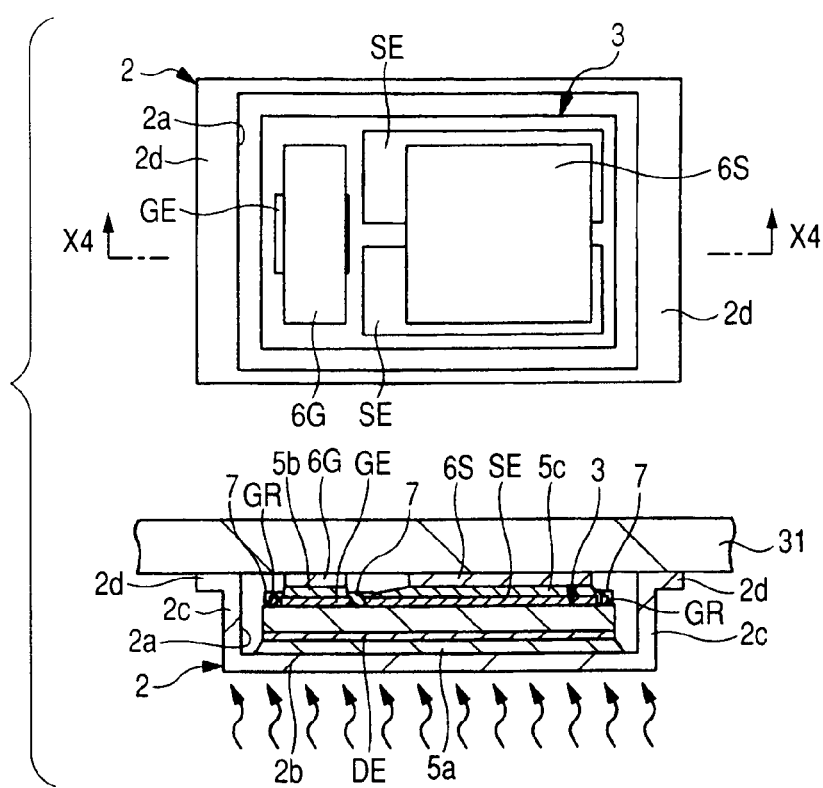
FIG. 17 is views showing a manufacturing process of the semiconductor device following FIG. 16, wherein the upper is a plan view of the semiconductor device during the manufacturing process, and the lower is a cross section view along a line X4-X4 of the upper.

Then, as shown in FIG. 17, the connection materials 5a to 5c are heated to bond among respective members (connection material heating and formation process). At that time, when the connection materials 5a to 5c comprise the silver paste, heating temperature is set to, for example, about 180° C. to 200° C. so that the silver paste is thermally cured. When the connection materials 5a to 5c comprise the brazing material, heating temperature is set to, for example, about 320° C. to 360° C. so that the brazing material is fused. At that time, as shown in the lower of FIG. 17, a flat pressing plate 31 is placed on both the mounting surfaces of the third part 2d of the metal cap 2 and the metal plate terminals 6G, 6S and then the metal plate terminals 6G, 6S are pressed downward, so that both the mounting surfaces of the third part 2d of the metal cap 2 and the metal plate terminals 6G, 6S are positioned in the same plane.

Figure 18:
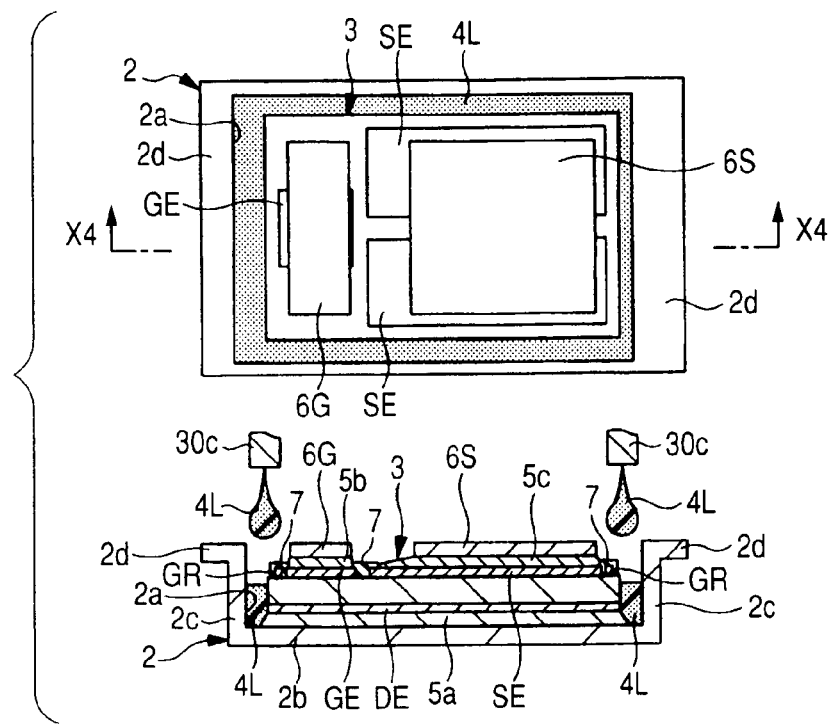
FIG. 18 is views showing a manufacturing process of the semiconductor device following FIG. 17, wherein the upper is a plan view of the semiconductor device during the manufacturing process, and the lower is a cross section view along a line X4-X4 of the upper.

Then, as shown in FIG. 18, a liquid resin material 4L is dropped into the recess 2a of the metal cap 2 through a nozzle 30c (sealing material drop process). At that time, the liquid resin material 4L is dropped, for example, into a gap between the metal plate terminals 6G, 6S and the recess 2a of the metal cap 2. In addition, the liquid resin material 4L is dropped into the recess 2a such that at least the outer circumferential corner of the semiconductor chip 3 in the recess 2a is covered with the resin material 4L. In the embodiment 1, since the metal plate terminals 6G, 6S project with respect to the second surface of the semiconductor chip 3, the resin material 4L can be easily poured into the recess 2a without covering or contaminating the metal plate terminals 6G, 6S by the resin material 4L.

Figure 19:
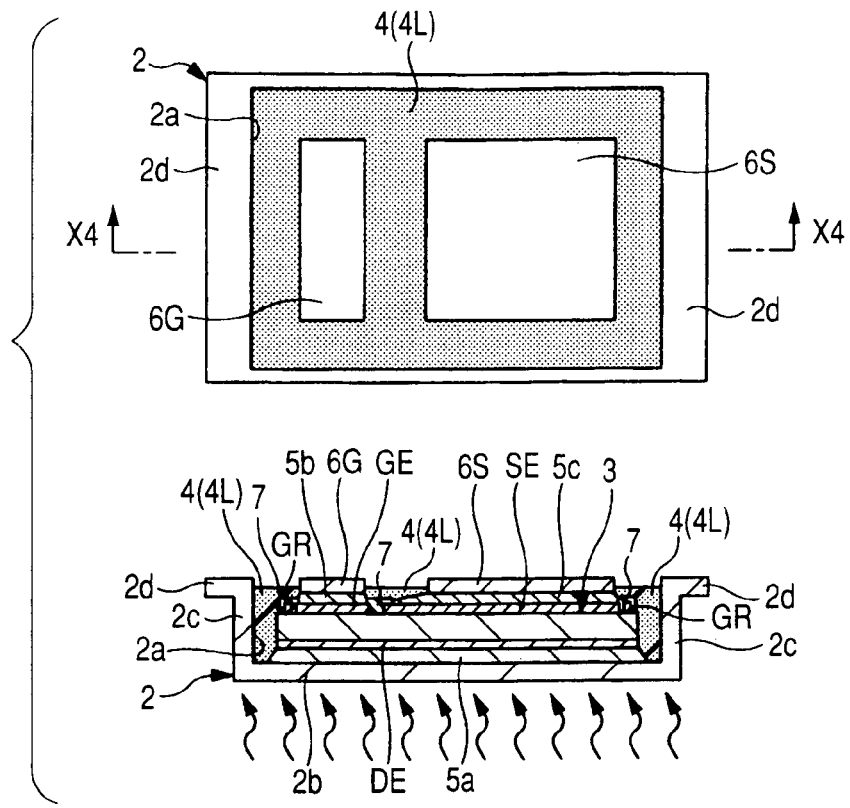
FIG. 19 is views showing a manufacturing process of the semiconductor device following FIG. 18, wherein the upper is a plan view of the semiconductor device during the manufacturing process, and the lower is a cross section view along a line X4-X4 of the upper.

Then, the resin material 4L is poured into the recess 2a such that it covers the whole surface including the side face of the semiconductor chip 3, the second surface, and the corner formed at the crossing portion between the side face and the second surface, and then as shown in FIG. 19, the whole body is heated so that the sealing material 4L is cured to from the resin sealing body 4 (sealing material curing process). Thus, the whole surface including the side face of the semiconductor chip 3, the second surface, and the corner formed at the crossing portion between the side face and the second surface is covered with the resin sealing body 4. Heating temperature at that time is, for example, about 180° C. irrespective of types of the connection materials 5a to 5c.

After that, exposed surfaces of the metal cap 2 and the metal plate terminals 6G, 6S are applied with, for example, the plating treatment (surface treatment process). In this way, the semiconductor device 1A is manufactured. When the connection materials 5a to 5c comprise the silver paste, the metal cap 2 and the metal plate terminals 6G, 6S in which palladium and gold are previously applied on surfaces in this order from the lower layer are used. When the connection materials 5a to 5c comprise the brazing material, metal plating such as lead-tin plating, tin-silver-cupper plating, or tin plating is applied in the surface treatment process.

Embodiment 2

Figure 20:
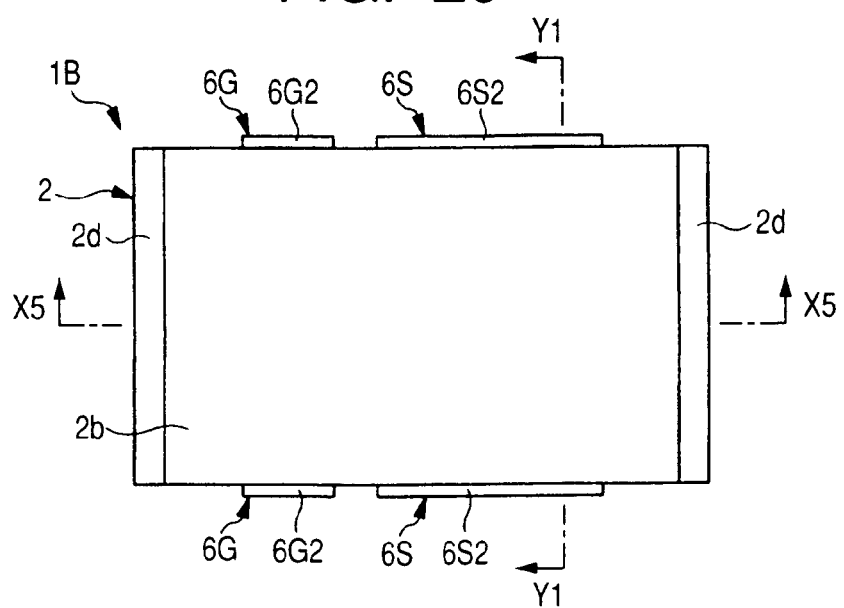
FIG. 20 is a plan view of a top of a semiconductor device as another embodiment of the invention.
Figure 21:
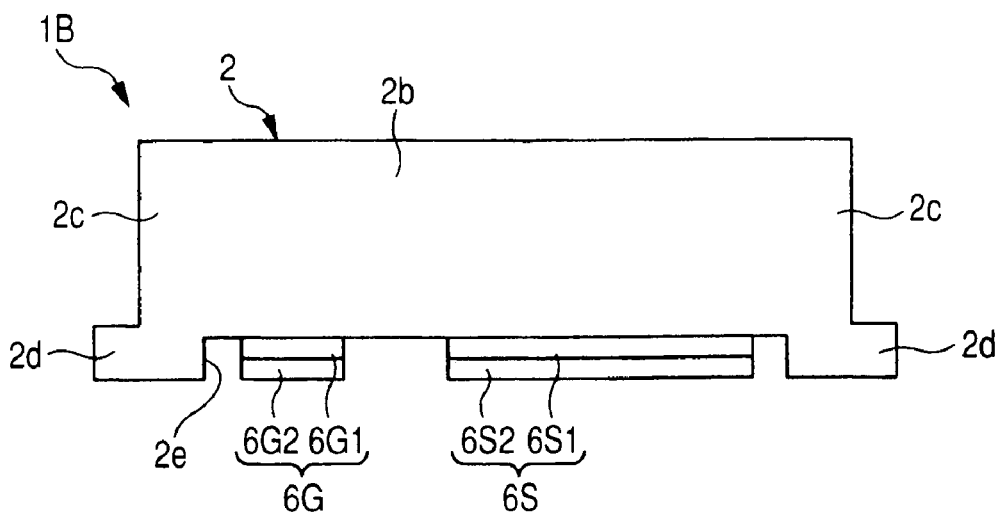
FIG. 21 is a side view of the semiconductor device of FIG. 20.
Figure 22:
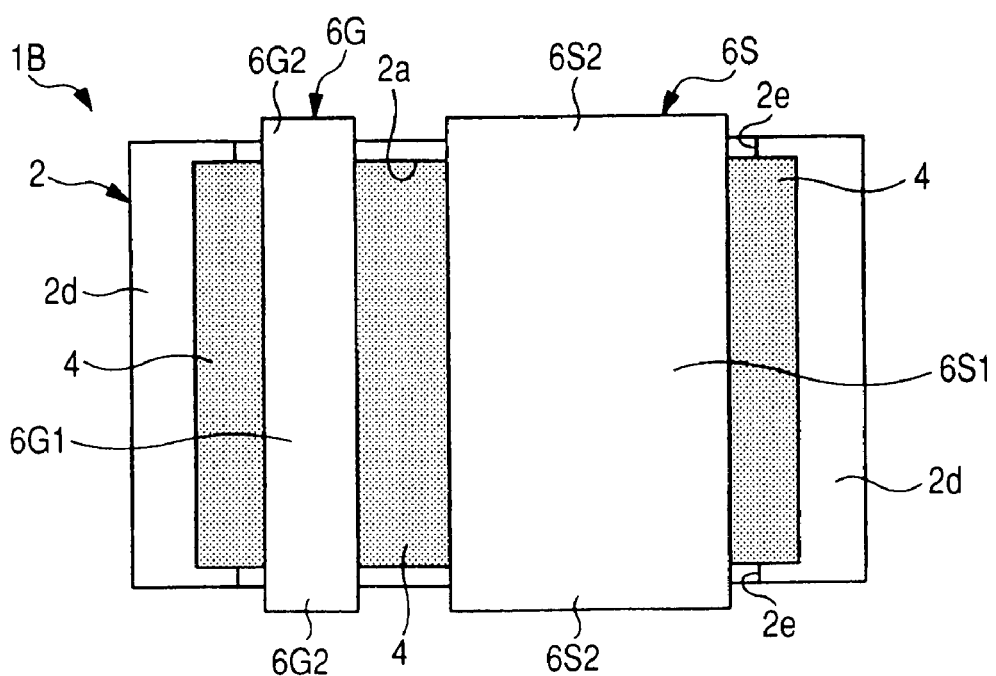
FIG. 22 is a plan view of a bottom of the semiconductor device of FIG. 20.
Figure 23:
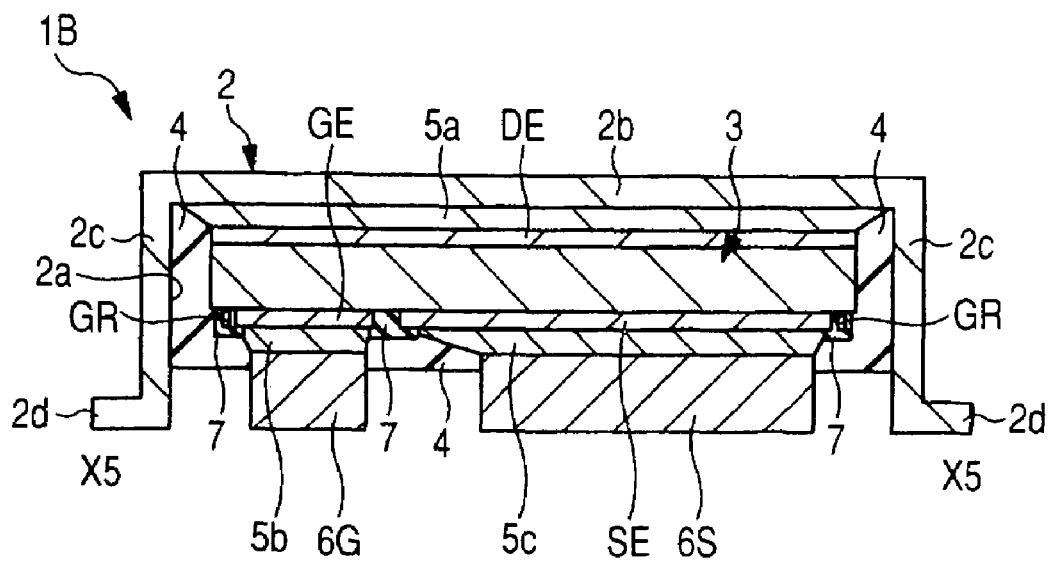
FIG. 23 is a cross section view along a line X5-X5 of the semiconductor device of FIG. 20.
Figure 24:
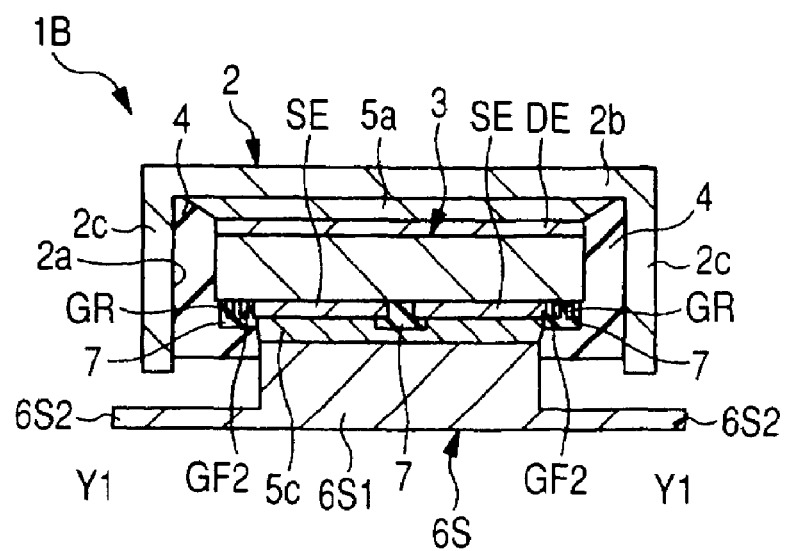
FIG. 24 is a cross section view along a line Y1-Y1 of the semiconductor device of FIG. 20.

FIG. 20 is a plan view of a top of a semiconductor device of the embodiment 2, FIG. 21 is a side view of the semiconductor device of FIG. 20, FIG. 22 is a plan view of a bottom of the semiconductor device of FIG. 20, FIG. 23 is a cross section view along a line X5-X5 of the semiconductor device of FIG. 20, and FIG. 24 is a cross section view along a line Y1-Y1 of the semiconductor device of FIG. 20.

In the semiconductor device 1B of the embodiment 2, a shallow recess 2e extending in a direction of the first part (head and upper part) is formed at lower parts of side faces of both longitudinal sides of the metal cap 2, and the metal plate terminals 6G, 6S extend long along a narrow direction of the metal cap 2 compared with the case of the embodiment 1, and respective two ends of them in the extending direction are protruded (exposed) outside of the metal cap 2 through respective recesses 2e at the lower parts of the side faces of both the longitudinal sides of the metal cap 2. The metal plate terminals 6G, 6S are formed in the flat and rectangular shape, and integrally have body portions 6G1, 6S1 and lead portions 6G2, 6S2 respectively. Thickness of the body portions 6G1, 6S1 is larger than that of the metal plate terminals 6G, 6S in the embodiment 1. The lead portions 6G2, 6S2 are formed by etching part of a base material of the metal plate terminals, and formed to have a small thickness compared with the body portions 6G1, 6S1. Ends of the lead portions 6G2, 6S2 are exposed from the metal cap 2. Other configurations than the above are omitted to be described because they are same as in the embodiment 1.

Figure 25:
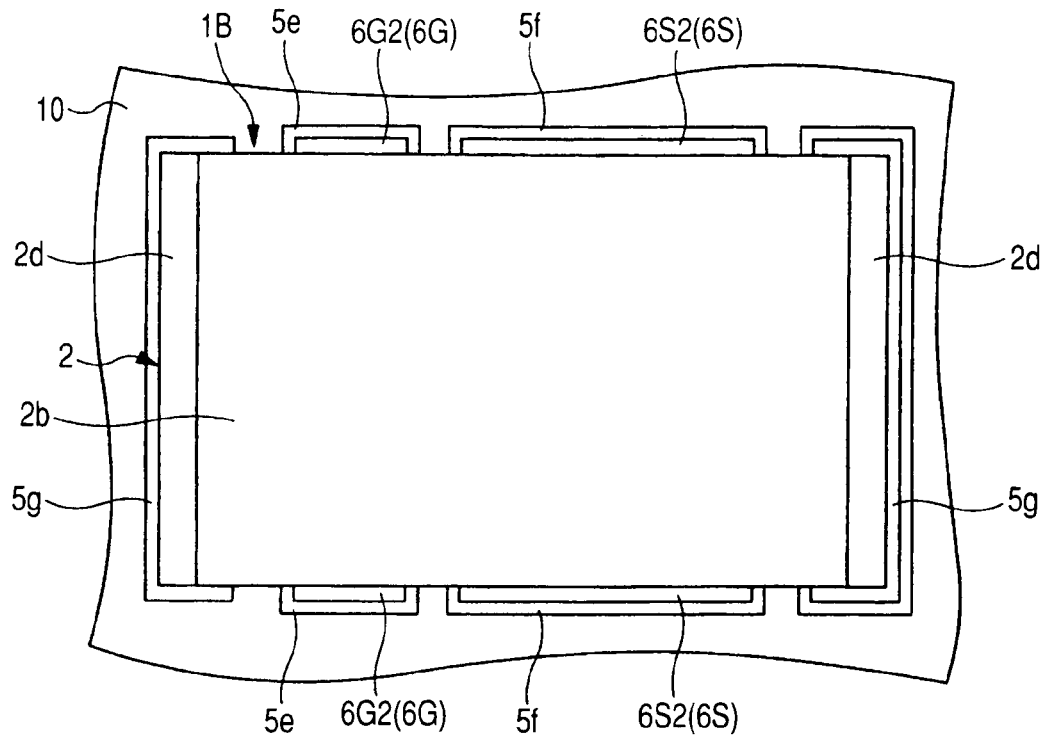
FIG. 25 is a plan view showing an example of mounting the semiconductor device of FIG. 20.
Figure 26:
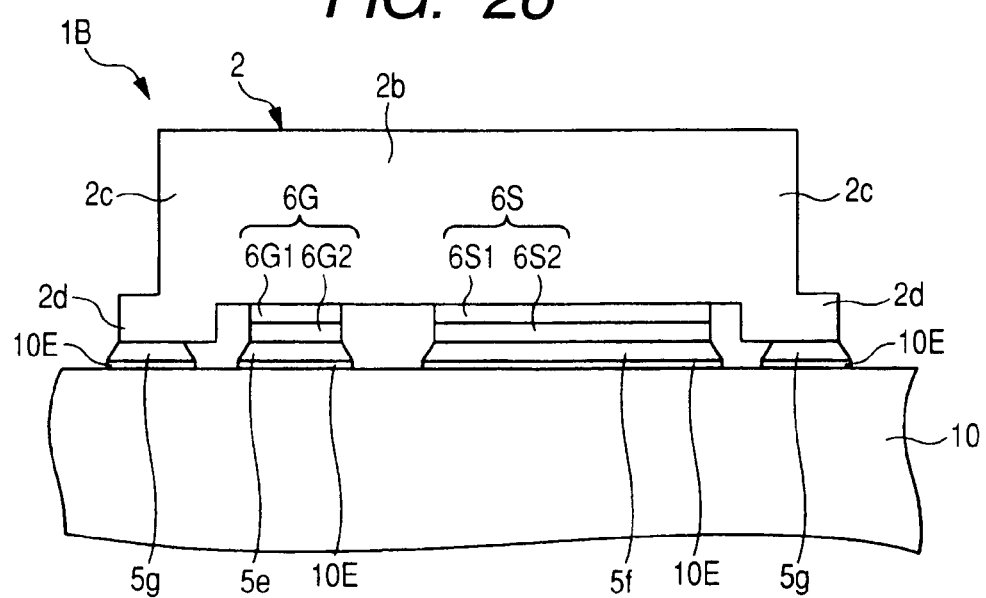
FIG. 26 is a side view of the semiconductor device of FIG. 25 during mounting.

FIG. 25 is a plan view showing an example of mounting the semiconductor device of FIG. 20, and FIG. 26 is a side view of the semiconductor device of FIG. 25. Although only a mounting portion of the semiconductor device 1B on the mounting board 10 is shown here, another semiconductor device (electronic component) is also mounted on the mounting board 10 similarly as the embodiment 1.

In the embodiment 2, the lead portions 6G2, 6S2 of the metal plate terminals 6G, 6S of the semiconductor device 1B are exposed outside through the recesses 2e in the side faces of the metal cap 2, and aspects of the connection materials 5e, 5f connected to the exposed lead portions 6G2, 6S2 can be visually confirmed. For example, when the connection materials 5e, 5f comprise the brazing material such as solder, whether solder fillet necessary for improving connection reliability is formed can be visually confirmed. That is, quality of connection condition between the metal plate terminals 6G, 6S and the electrodes 10E on the mounting board 10 can be easily determined from the aspects of the connection materials 5e, 5f exposed through the recesses 2e in the side faces of the metal cap 2.

Moreover, since the lead portions 6G2, 6S2 of the metal plate terminals 6G, 6S of the semiconductor device 1B are exposed outside through the recesses 2e in the side faces of the metal cap 2, a mounting direction of the semiconductor device 1B can be easily confirmed externally. Therefore, error in the mounting direction of the semiconductor device 1B can be prevented. Although a top of the metal cap 2 can be added with a mark indicating the mounting direction, since the top of the metal cap 2 is sometimes attached with a radiating fin, indiscriminate addition of the mark may cause reduction in heat radiation, therefore the mark is desirably not added. In the embodiment 2, since the mounting direction of the semiconductor device 1B can be confirmed from the lead portions 6G2, 6S2 of the metal plate terminals 6G, 6S exposed outside the metal cap 2, the top of the metal cap 2 need not be added with the mark, and the radiating fin can be attached to the top of the metal cap 2 without reducing the heat radiation.

Furthermore, since surface area and volume of the metal plate terminals 6G, 6S can be increased compared with the case of the embodiment 1, radiation of heat generated during operation of the semiconductor device 1B can be improved compared within the embodiment 1. Furthermore, ON-resistance of the semiconductor device 1B can be reduced compared with the embodiment 1 because of the same reason.

Next, an example of a method for manufacturing the semiconductor device 1B of the embodiment 2 is described according to FIG. 27 to FIG. 30. The upper of each of FIG. 27 to FIG. 30 is a plan view of a bottom (leg) side of the semiconductor device 1B during a manufacturing process, and the lower is a cross section view along a line X6-X6 of the upper each.

Figure 27:
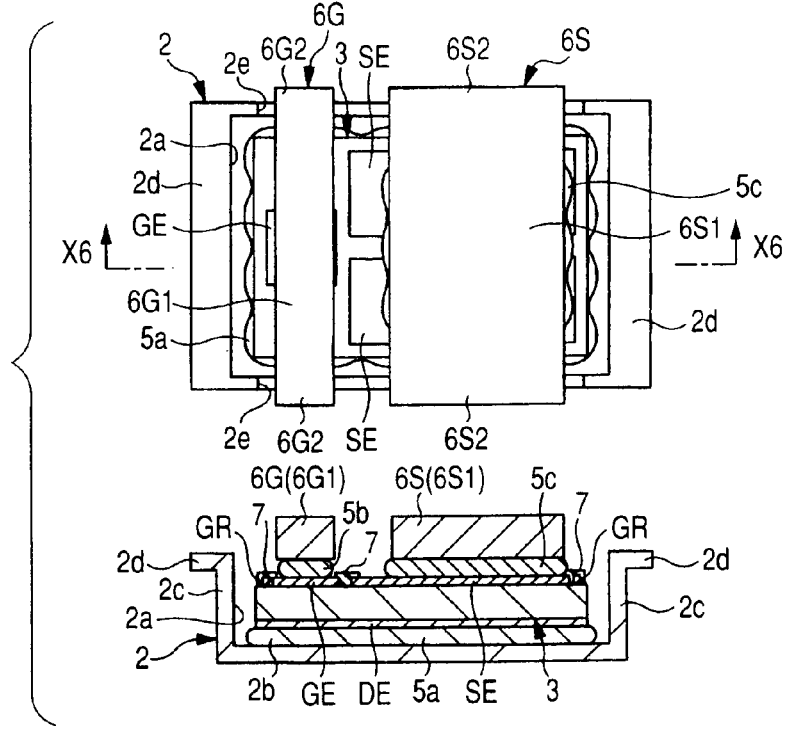
FIG. 27 is views, wherein the upper is a plan view of the semiconductor device of FIG. 20 during a manufacturing process, and the lower is a cross section view along a line X6-X6 of the upper.

First, the same processes as those described according to FIG. 13 to FIG. 15 of the embodiment 1 are performed using the metal cap 2 having the recess 2e of the embodiment 2, and then as shown in FIG. 27, the metal plate terminals 6G, 6S are mounted on tops of the gate electrode GE and source electrode SE of the semiconductor chip 3 via the connection materials 5b, 5c respectively (mounting process of external connection terminal). Here, convex surfaces of the body portions 6G1, 6S1 of the metal plate terminals 6G, 6S are directed to a side of the gate electrode GE and the source electrode SE. Again in this case, as shown in the lower of FIG. 27, a case where mounting surfaces of the metal plate terminals 6G, 6S are protruded upward with respect to the mounting surface of the third part 2d of the metal cap 2 is exemplified.

Figure 28:
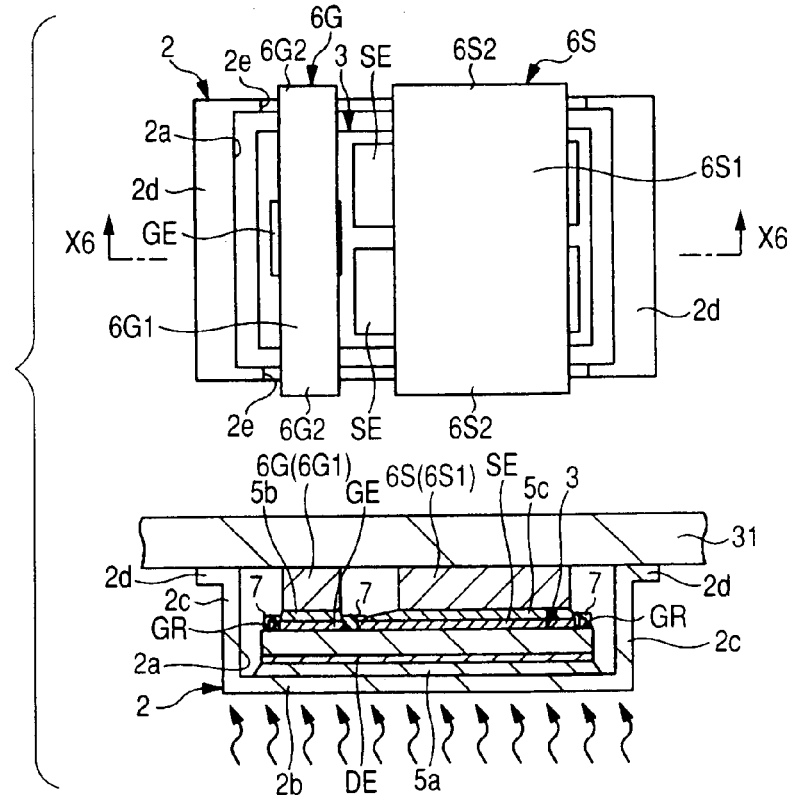
FIG. 28 is views showing a manufacturing process of the semiconductor device following FIG. 27, wherein the upper is a plan view of the semiconductor device during the manufacturing process, and the lower is a cross section view along a line X6-X6 of the upper.

Then, as shown in FIG. 28, the connection materials 5a to 5c are heated to bond among respective members (connection material heating and formation process). Heating temperature at that time is same as that described according to FIG. 17 of the embodiment 1. Again in this case, as shown in the lower of FIG. 28, the flat pressing plate 31 is placed on both the mounting surfaces of the third part 2d of the metal cap 2 and the metal plate terminals 6G, 6S and then the metal plate terminals 6G, 6S are pressed downward, so that both the mounting surfaces of the third part 2d of the metal cap 2 and the metal plate terminals 6G, 6S are positioned in the same plane.

Figure 29:
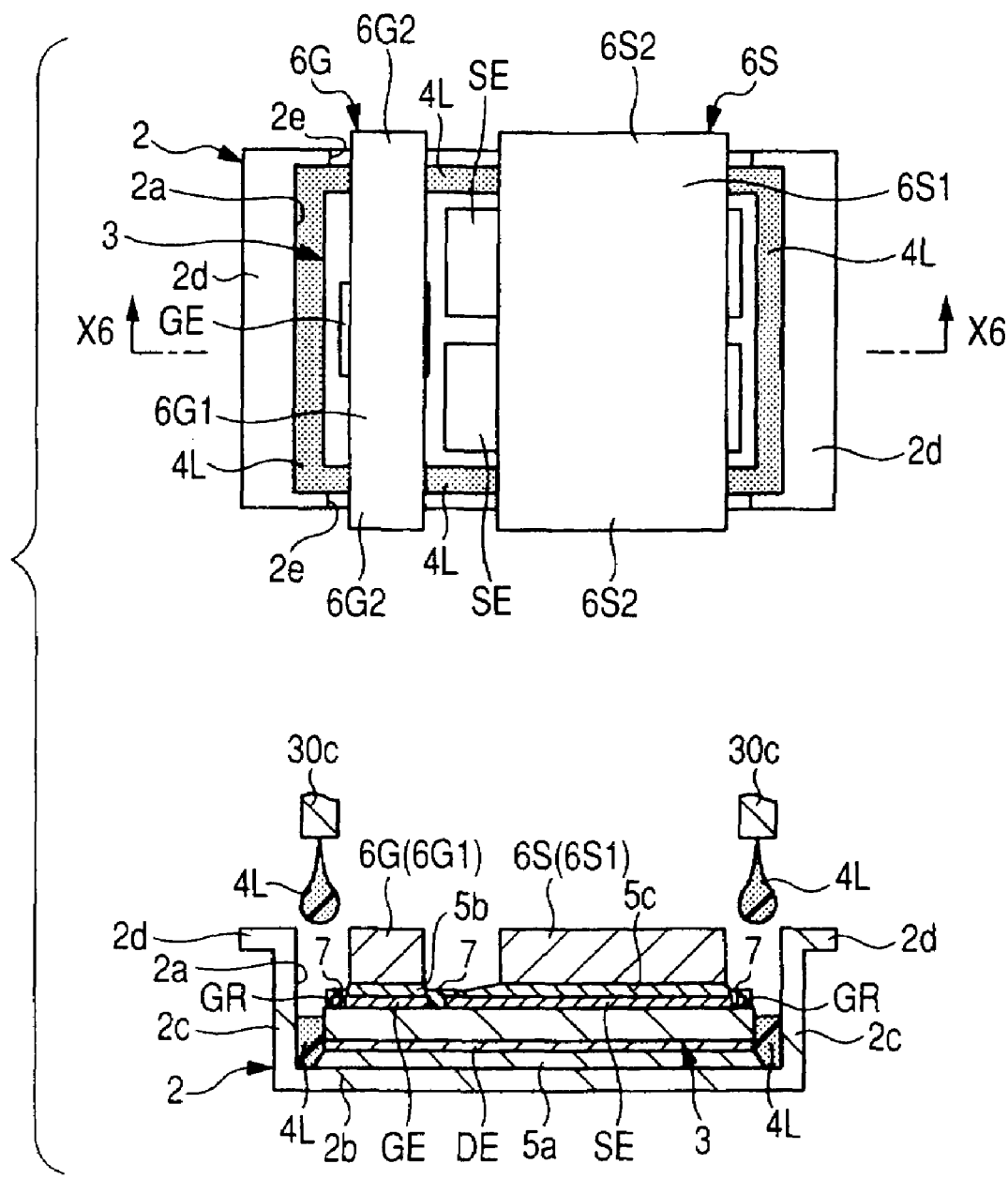
FIG. 29 is views showing a manufacturing process of the semiconductor device following FIG. 28, wherein the upper is a plan view of the semiconductor device during the manufacturing process, and the lower is a cross section view along a line X6-X6 of the upper.

Then, as shown in FIG. 29, the liquid resin material 4L is dropped into the recess 2a of the metal cap 2 through the nozzle 30c similarly as described according to FIG. 18 of the embodiment 1 (sealing material drop process). Again in the embodiment 2, since the metal plate terminals 6G, 6S are protruded with respect to the second surface of the semiconductor chip 3 as described above, the resin material 4L can be easily poured into the recess 2a without covering or contaminating the metal plate terminals 6G, 6S by the resin material 4L.

Figure 30:
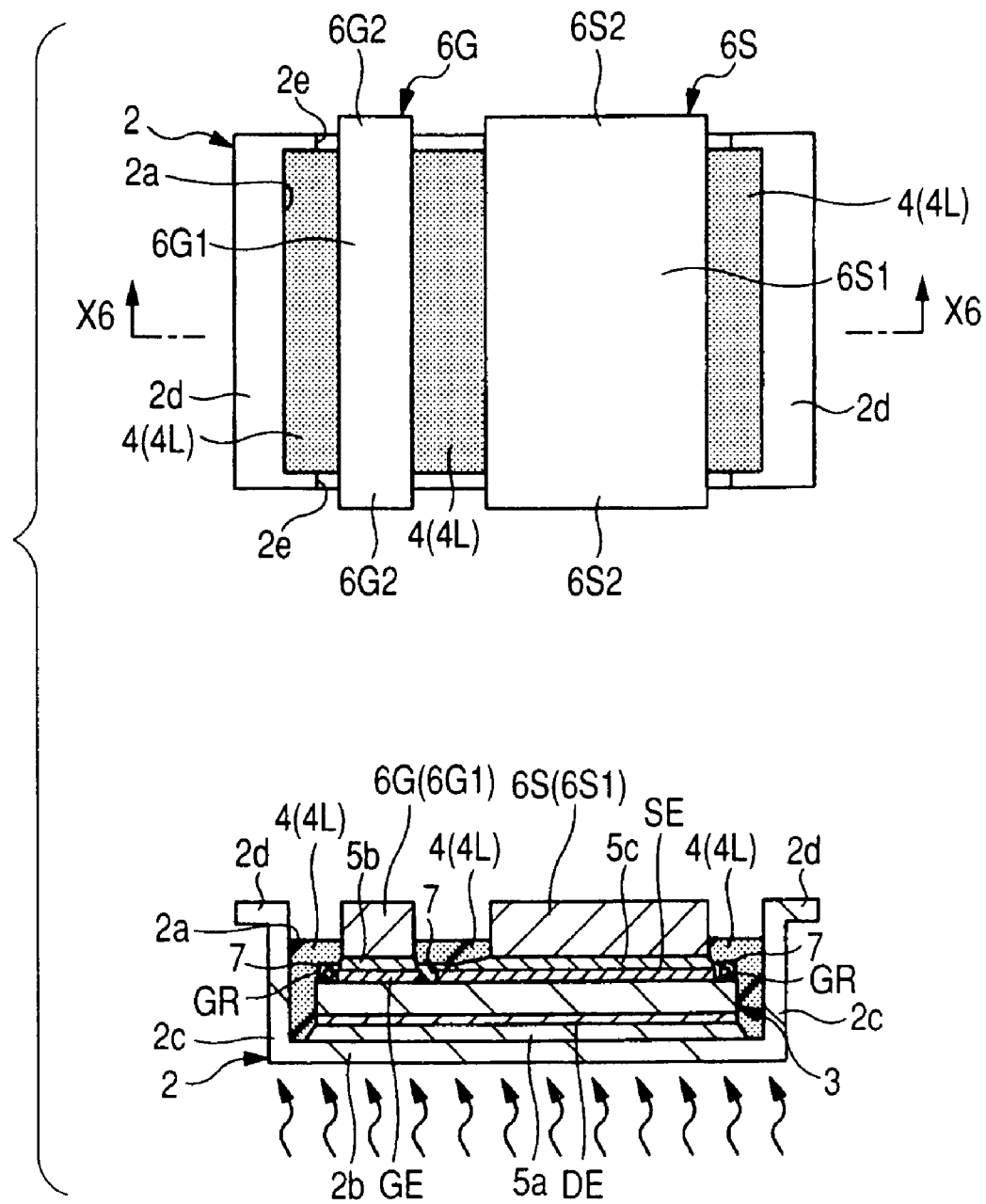
FIG. 30 is views showing a manufacturing process of the semiconductor device following FIG. 29, wherein the upper is a plan view of the semiconductor device during the manufacturing process, and the lower is a cross section view along a line X6-X6 of the upper.

Then, the resin material 4L is poured into the recess 2a such that it covers the whole surface including the side face of the semiconductor chip 3, the second surface, and the corner formed at the crossing portion between the side face and the second surface, and then as shown in FIG. 30, the whole body is heated so that the sealing material 4L is cured to from the resin sealing body 4 (sealing material curing process). Thus, the whole surface including the side face of the semiconductor chip 3, the second surface, and the corner formed at the crossing portion between the side face and the second surface is covered with the resin sealing body 4. Heating temperature at that time is same as that described according to FIG. 19 of the embodiment 1.

After that, exposed surfaces of the metal cap 2 and the metal plate terminals 6G, 6S are applied with the plating treatment similarly as described in the embodiment 1 (surface treatment process), and thus the semiconductor device 1B is manufactured.

Embodiment 3

Figure 31:
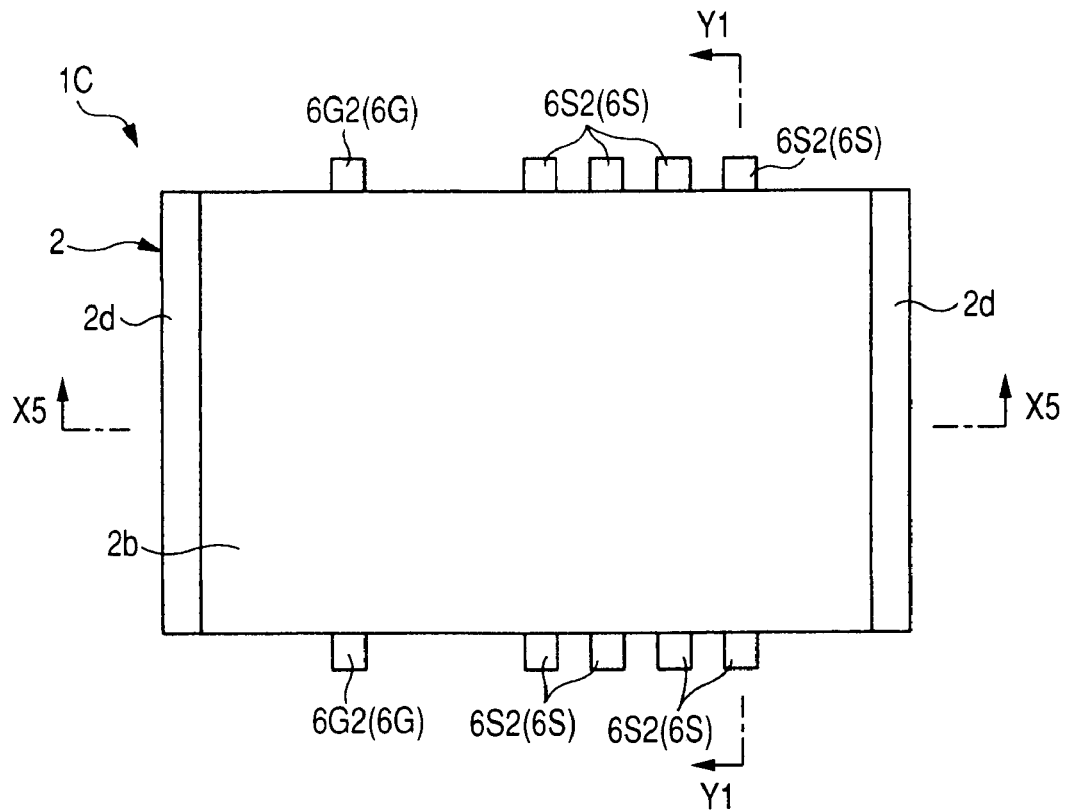
FIG. 31 is a plan view of a top of a semiconductor device as still another embodiment of the invention.
Figure 32:
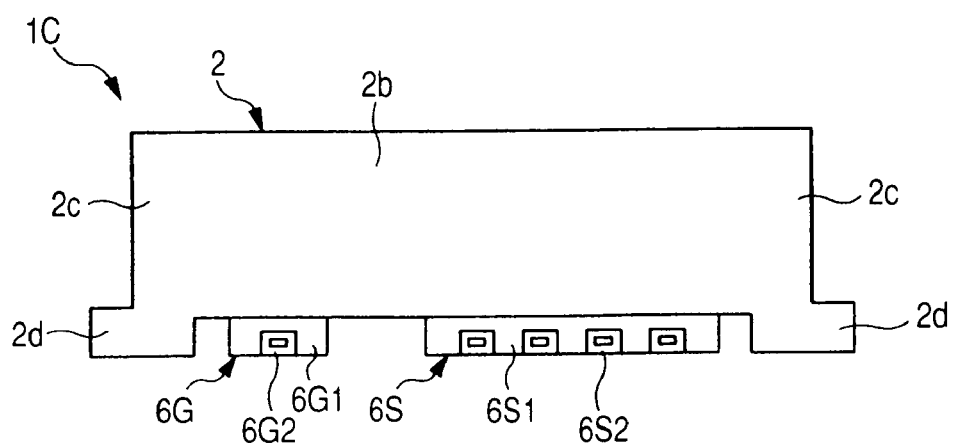
FIG. 32 is a side view of the semiconductor device of FIG. 31.
Figure 33:
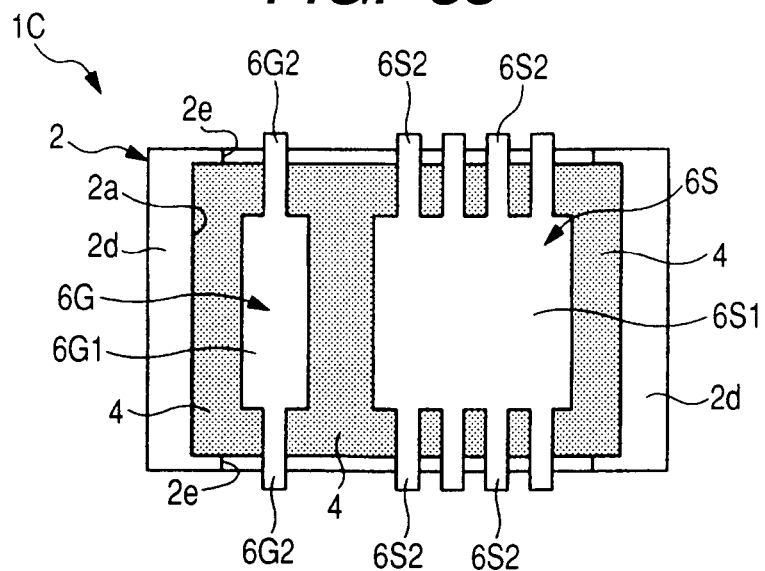
FIG. 33 is a plan view of a bottom of the semiconductor device of FIG. 31.

FIG. 31 is a plan view of a top of a semiconductor device of the embodiment 3, FIG. 32 is a side view of the semiconductor device of FIG. 31, and FIG. 33 is a plan view of a bottom of the semiconductor device of FIG. 31. A cross section view along a line X5-X5 of FIG. 31 is equal to that of FIG. 23, and a cross section view along a line Y1-Y1 of FIG. 31 is equal to that of FIG. 24.

A semiconductor device 1C in the embodiment 3 is approximately equal to that of the embodiment 2. It differs in that the lead portions 6G2, 6S2 of the metal plate terminals 6G, 6S is small in width compared with the body portions 6G1, 6S1. The metal plate terminal 6S has a plurality of lead portions 6S2 that extend from one body portion 6S1, and is generally formed into a comblike shape. A mounting condition of the semiconductor device 1C is not different from that described in the embodiment 2 except for smaller width of the lead portions 6G2, 6S2, therefore diagrammatic representation and description of it are omitted.

Next, an example of a method for manufacturing the semiconductor device 1C of the embodiment 3 is described according to FIG. 34 to FIG. 38. The upper of each of FIG. 34 to FIG. 38 is a plan view of a bottom (leg) side of the semiconductor device 1C during a manufacturing process, and the lower is a cross section view along a line X7-X7 of the upper each.

Figure 34:
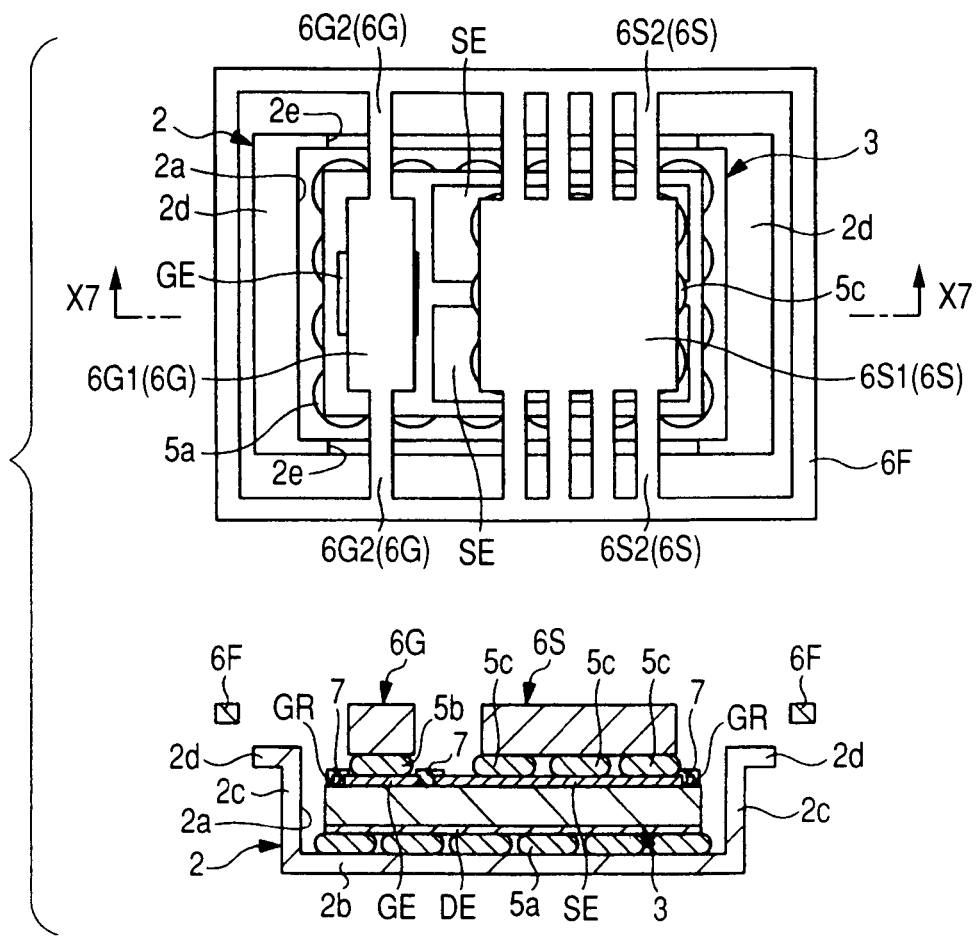
FIG. 34 is views, wherein the upper is a plan view of the semiconductor device of FIG. 31 during a manufacturing process, and the lower is a cross section view along a line X7-X7 of the upper.

First, the same processes as those described according to FIG. 13 to FIG. 15 of the embodiment 1 are performed using the metal cap 2 having the recess 2e of the embodiment 2, and then as shown in FIG. 34, the metal plate terminals 6G, 6S are mounted on the tops of the gate electrode GE and source electrode SE of the semiconductor chip 3 via the connection materials 5b, 5c respectively similarly as the embodiment 2 (mounting process of external connection terminal). Here, the metal plate terminals 6G, 6S are integral with a frame 6F through the lead portions 6G2, 6S2.

Figure 35:
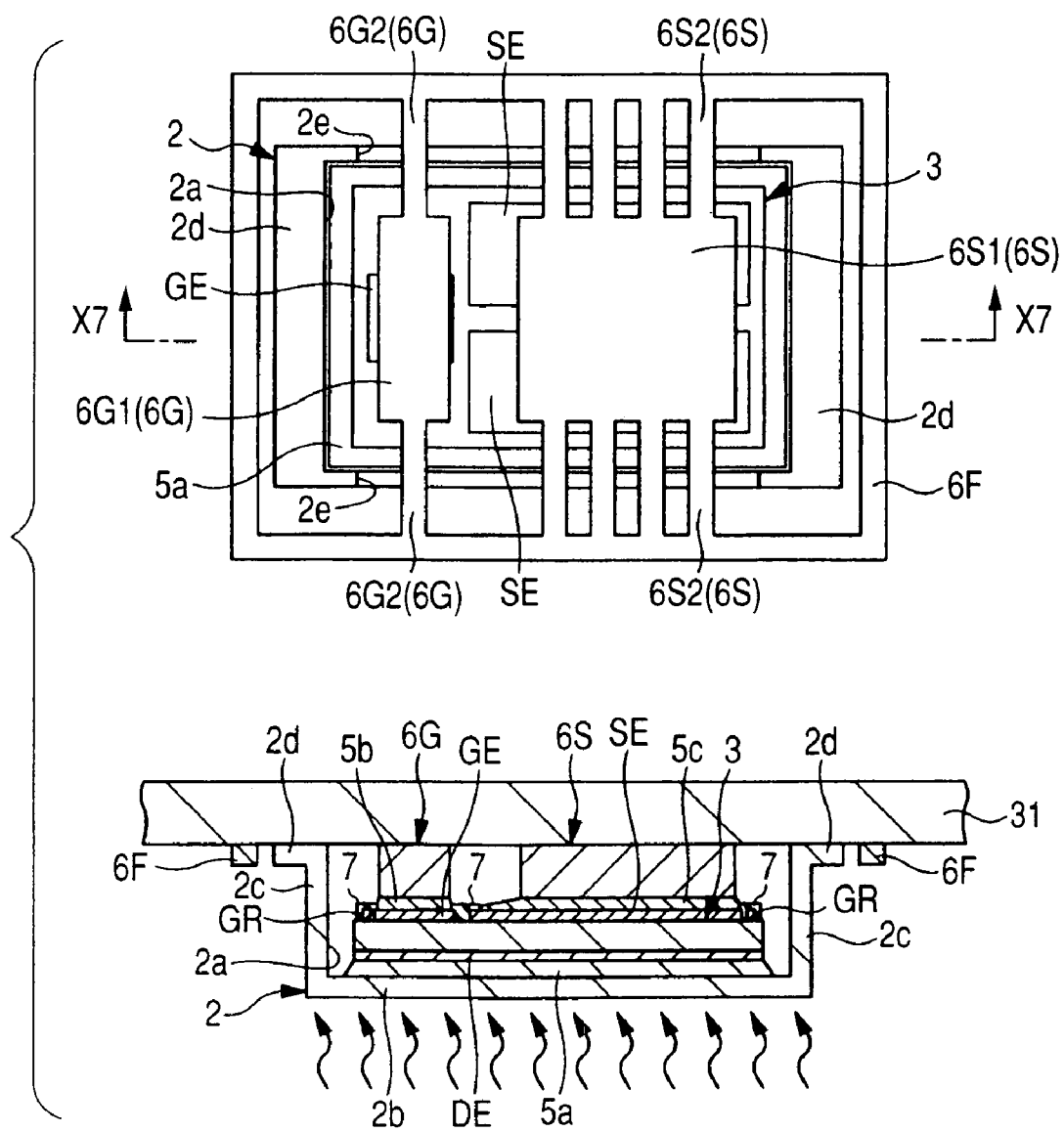
FIG. 35 is views showing a manufacturing process of the semiconductor device following FIG. 34, wherein the upper is a plan view of the semiconductor device during the manufacturing process, and the lower is a cross section view along a line X7-X7 of the upper.

Then, as shown in FIG. 35, the connection materials 5a to 5c are heated to bond among respective members (connection material heating and formation process). Heating temperature at that time is same as that described according to FIG. 17 of the embodiment 1. Again in this case, as shown in the lower of FIG. 35, the flat pressing plate 31 is placed on both the mounting surfaces of the third part 2d of the metal cap 2 and the metal plate terminals 6G, 6S, so that both the mounting surfaces of the third part 2d and the metal plate terminals 6G, 6S are positioned in the same plane.

Figure 36:
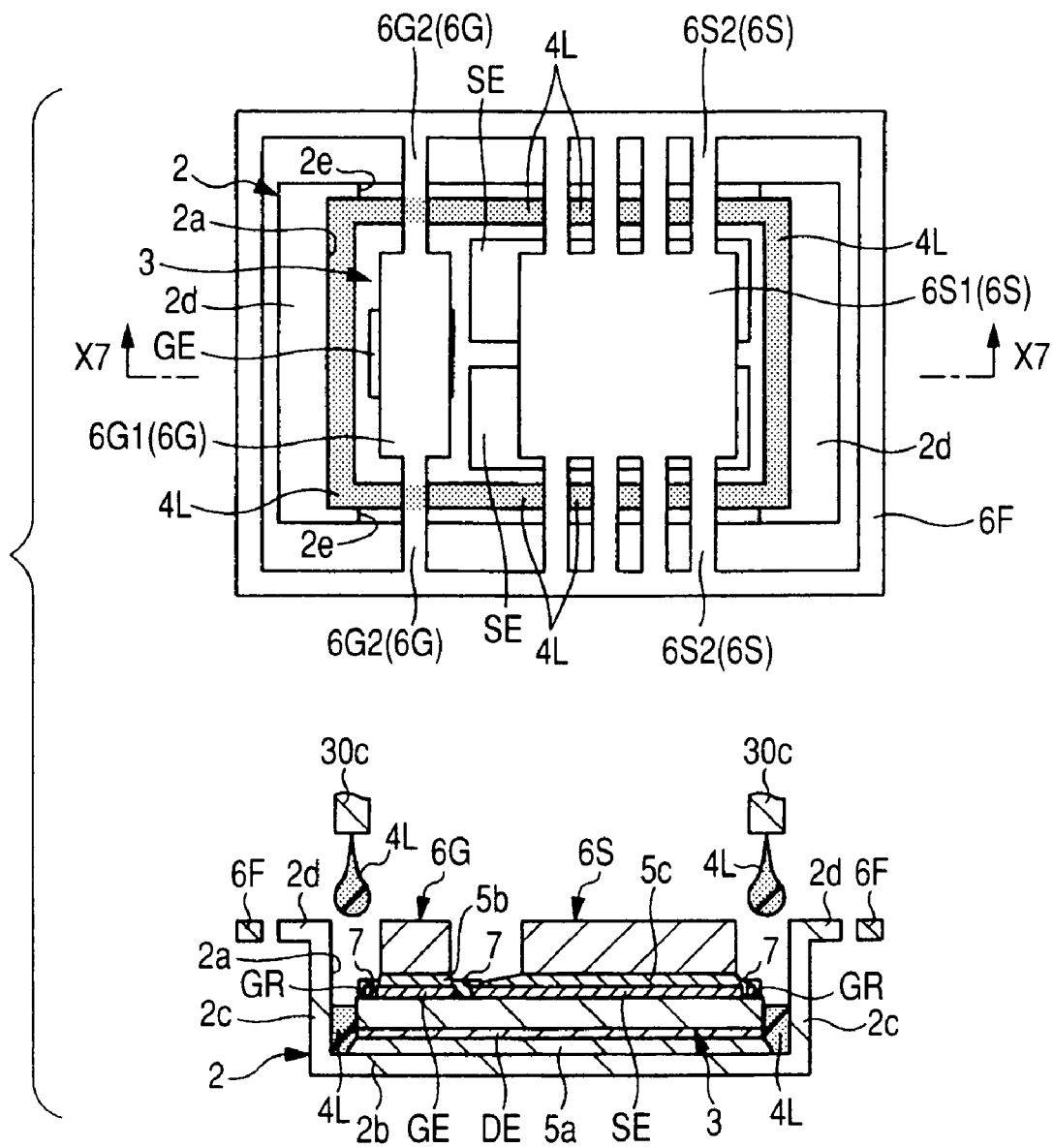
FIG. 36 is views showing a manufacturing process of the semiconductor device following FIG. 35, wherein the upper is a plan view of the semiconductor device during the manufacturing process, and the lower is a cross section view along a line X7-X7 of the upper.

Then, as shown in FIG. 36, the liquid resin material 4L is dropped into the recess 2a of the metal cap 2 through the nozzle 30c similarly as described according to FIG. 18 of the embodiment 1 (sealing material drop process). Again in the embodiment 3, similarly as described in the embodiments 1 and 2, the resin material 4L can be easily poured into the recess 2a without covering or contaminating the metal plate terminals 6G, 6S by the resin material 4L.

Figure 37:
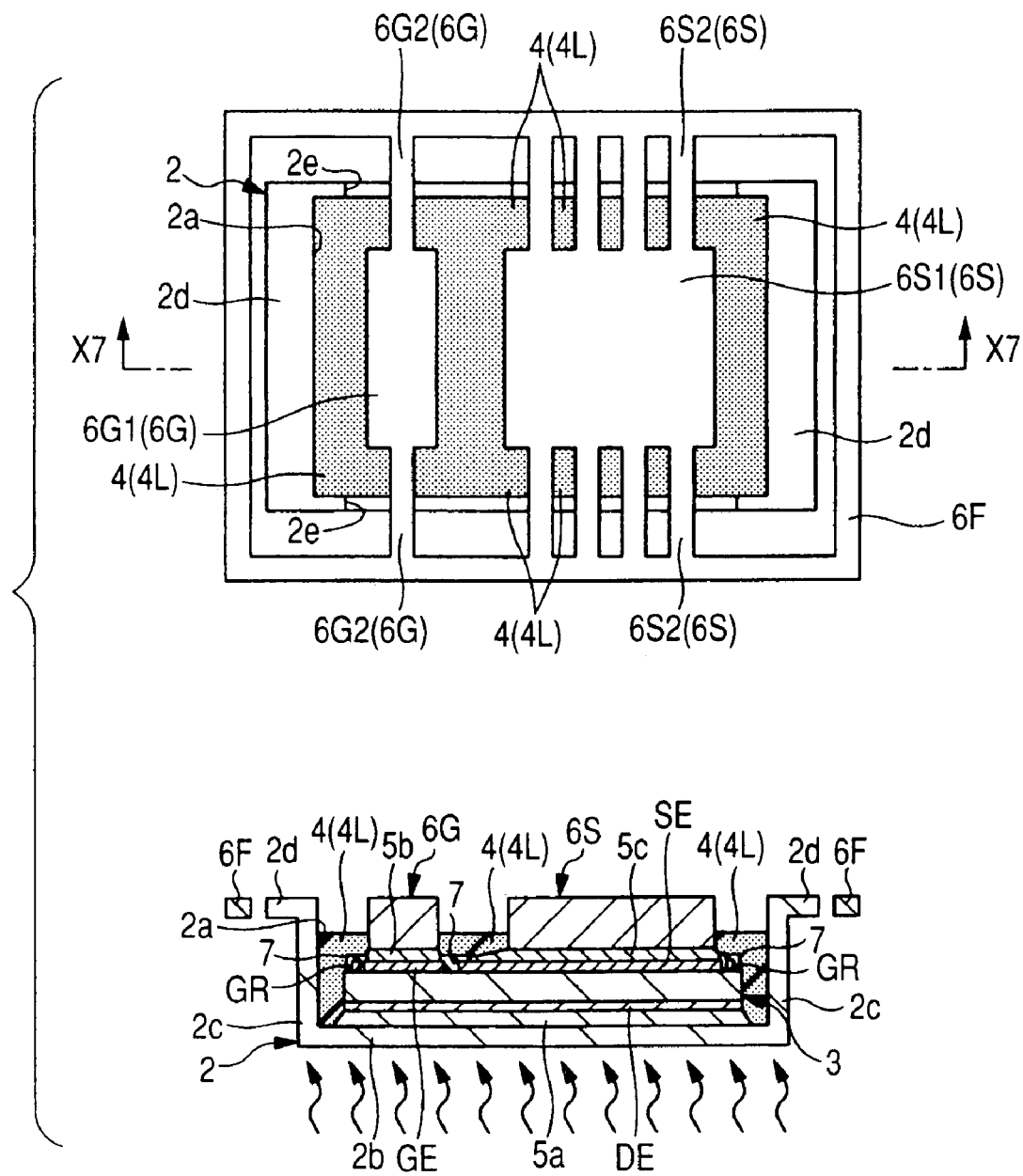
FIG. 37 is views showing a manufacturing process of the semiconductor device following FIG. 36, wherein the upper is a plan view of the semiconductor device during the manufacturing process, and the lower is a cross section view along a line X7-X7 of the upper.

Then, the resin material 4L is poured into the recess 2a such that it covers the whole surface including the side face of the semiconductor chip 3, the second surface, and the corner formed at the crossing portion between the side face and the second surface, and then as shown in FIG. 37, the whole body is heated so that the sealing material 4L is cured to from the resin sealing body 4 (sealing material curing process). Thus, the whole surface including the side face of the semiconductor chip 3, the second surface, and the corner formed at the crossing portion between the side face and the second surface is covered with the resin sealing body 4. Heating temperature at that time is same as that described according to FIG. 19 of the embodiment 1.

Figure 38:
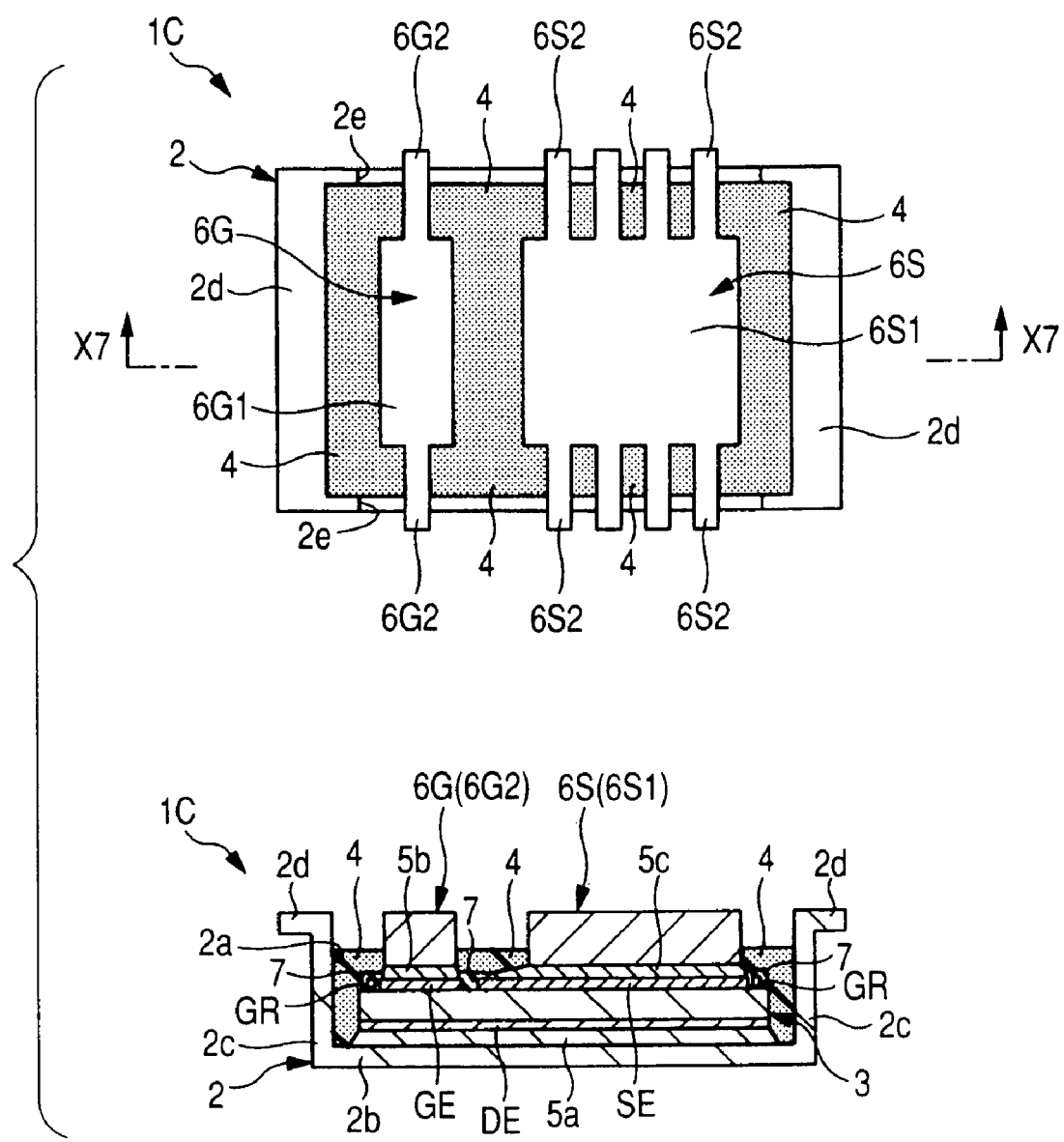
FIG. 38 is views showing a manufacturing process of the semiconductor device following FIG. 37, wherein the upper is a plan view of the semiconductor device during the manufacturing process, and the lower is a cross section view along a line X7-X7 of the upper.

After that, exposed surfaces of the metal cap 2, metal plate terminals 6G, 6S, and frame 6F are applied with the plating treatment similarly as described in the embodiment 1 (surface treatment process), and then as shown in FIG. 38, the lead portions 6G2, 6S2 are cut off, thereby the metal plate terminals 6G, 6S are separated from the frame 6F (lead cut-off process), and thus the semiconductor device 1C is manufactured.

Hereinbefore, the invention made by the inventor has been described specifically according to the embodiments, however, it will be appreciated that the invention is not limited to the embodiments, and various modifications can be made within a scope without departing from the gist of the invention.

For example, while the case where the gate electrodes was arranged in a stripe type was described in the embodiments 1 to 3, the arrangement is not limited to this, and for example, the gate electrodes can be arranged in a lattice pattern or a mesh pattern, so called mesh type. Since gate density can be improved by arranging them in the mesh type, the ON-resistance can be further decreased. In addition, since gate resistance can be decreased, the switching loss can be also decreased.

While the case where the main material of the metal plate terminal (external connection terminal) was cupper was described in the embodiments 1 to 3, it is not limited to this, and for example, 42 alloy (Fe-42Ni; linear expansion coefficient is, for example, about 4 ppm/° C.) or CIC (Cu/Invar alloy (Fe-36Ni)/Cu; linear expansion coefficient is, for example, about 1.5 ppm/° C.) may be used. Such a material having a linear expansion coefficient that is further close to the linear expansion coefficient of silicon (about 3 ppm/° C.) is used, thereby since thermal stress applied to a connecting portion between the semiconductor device and the mounting board can be reduced, life of the connecting portion can be improved.

While the case where the power transistor was the power MIS FET was described in the embodiments 1 to 3, it is not limited to this, and the power transistor can be variously modified, for example, the power transistor may be the bipolar transistor or the IGBT (Insulated Gate Bipolar Transistor). In this case, the source electrode SE and the metal plate terminal for source 6S of the power MIS FET correspond to an emitter electrode and a metal plate terminal for emitter (external connection terminal) of the bipolar transistor or the IGBT; the gate electrode GE and the metal plate terminal for gate 6G of the power MIS FET correspond to a base electrode and a metal plate terminal for base (external connection terminal) of the bipolar transistor or a gate electrode and a metal plate terminal for gate (external connection terminal) of the IGBT respectively; and the drain electrode DE and the external terminal for drain (third part 2d) of the power MIS FET correspond to a collector electrode and an external connection terminal for collector of the bipolar transistor or the IGBT.

While the case where the invention made by mainly the inventor was used for a power circuit for driving CPU or DSP that was an application field as the background of the invention was described in the above description, the invention is not limited thereto, and can be variously used. For example, it can be used for power circuits for driving other circuits.

INDUSTRIAL APPLICABILITY

The invention can be used for manufacture of a semiconductor device having a power transistor.

What is claimed is:

1. A semiconductor device that has a semiconductor chip, a conductive cap connected to the semiconductor chip, and a sealing resin body for sealing the semiconductor chip, and can be mounted on a mounting board, wherein
the conductive cap comprises an upper part, a side part, and a leg,
the semiconductor chip is disposed in a region enclosed by the upper part and the side part of the conductive cap,
the semiconductor chip has an upper electrode on a top and first and second lower-electrodes on a bottom respectively,
the upper electrode of the semiconductor chip is bonded to the upper part of the conductive cap via a conductive, connection material for cap connection,
the first lower electrode of the semiconductor chip is bonded to a first external connection terminal via a conductive, first connection material,
the second lower electrode of the semiconductor chip is bonded to a second external connection terminal via a conductive, second connection material,
the sealing resin body covers the semiconductor chip, and is filled into the conductive cap such that the first and second, external connection terminals are exposed, and
the leg of the conductive cap, and the first and second, external connection terminals can be electrically connected to electrodes on the mounting board respectively.

2. The semiconductor device according to claim 1, wherein a MIS FET is formed in the semiconductor chip, and the upper electrode, the first lower electrode and the second lower electrode of the semiconductor chip are electrically connected to a drain region, gate electrode, and source region of the MIS FET respectively.

3. The semiconductor device according to claim 2, wherein the MIS FET has a trench gate structure having the gate electrode in a trench formed in a semiconductor substrate.

4. The semiconductor device according to claim 1, wherein the first and the second, connection materials comprise silver paste.

5. The semiconductor device according to claim 1, wherein the first and the second, external connection terminals have a function of loosening control of a surface level of the resin sealing body.

6. The semiconductor device according to claim 1, wherein the first and the second, external connection terminals have a function of making an outer terminal of the semiconductor device to be versatile.

7. The semiconductor device according to claim 1, wherein the first external connection terminal, the second external connection terminal, the first connection material, and the second connection material have a function of buffering thermal stress generated due to difference in thermal expansion coefficient between the semiconductor chip and the mounting board.

8. The semiconductor device according to claim 1, wherein materials of the first and the second, external connection terminals comprise a metal material having a thermal expansion coefficient in the middle of thermal expansion coefficient of the semiconductor chip and thermal expansion coefficient of the mounting board.

9. The semiconductor device according to claim 1, wherein the materials of the first and the second, external connection terminals comprise copper as main material.

10. The semiconductor device according to claim 1, wherein a recess is formed in the side part of the conductive cap such that part of the first and the second, external connection terminals is exposed from a side face of the conductive cap.

* * * * *